(12) United States Patent
Matsuo et al.

(10) Patent No.: US 12,477,692 B2
(45) Date of Patent: Nov. 18, 2025

(54) CONNECTOR AND CONNECTOR SYSTEM

(71) Applicant: I-PEX Inc., Kyoto (JP)

(72) Inventors: Shogo Matsuo, Machida (JP); Kohei Nishiyama, Machida (JP); Masashi Nakamura, Ogori (JP)

(73) Assignee: I-PEX Inc., Kyoto (JP)

( * ) Notice: Subject to any disclaimer, the term of this patent is extended or adjusted under 35 U.S.C. 154(b) by 446 days.

(21) Appl. No.: 17/921,599

(22) PCT Filed: Apr. 27, 2021

(86) PCT No.: PCT/JP2021/016859
§ 371 (c)(1),
(2) Date: Oct. 26, 2022

(87) PCT Pub. No.: WO2021/221076
PCT Pub. Date: Nov. 4, 2021

(65) Prior Publication Data
US 2023/0180440 A1    Jun. 8, 2023

(30) Foreign Application Priority Data
May 1, 2020    (JP) .................................. 2020-081320

(51) Int. Cl.
*H05K 7/20* (2006.01)
*H01R 12/71* (2011.01)
(Continued)

(52) U.S. Cl.
CPC ......... *H05K 7/2039* (2013.01); *H01R 12/714* (2013.01); *H01R 12/73* (2013.01); *H05K 1/181* (2013.01); *H05K 2201/10189* (2013.01)

(58) Field of Classification Search
CPC ...... H01R 12/714; H01R 2/73; H05K 7/2039; H05K 1/181
(Continued)

(56) References Cited

U.S. PATENT DOCUMENTS 1,177,603 A * 4/1916 Cloud ................... F16L 27/093
                                                   285/190
7,329,054 B1 * 2/2008 Epitaux ................ G02B 6/4249
                                                   385/89
(Continued)

FOREIGN PATENT DOCUMENTS

CN      2544424 Y    4/2003
CN      102891411 A  1/2013
(Continued)

OTHER PUBLICATIONS

Chinese Office Action dated Nov. 19, 2024, issued for the corresponding Chinese Patent Application No. 202180032437.1 and English Translation, 16 pages.

*Primary Examiner* — Tulsidas C Patel
(74) *Attorney, Agent, or Firm* — Howard & Howard Attorneys PLLC

(57) ABSTRACT

A connector system (1) includes a connector (10) that detachably mates with a mating connector (20) mounted on an external circuit board (30), and an abutting member (40) fixed to the external circuit board (30). The connector (10) includes a circuit board (200) that connects to an external device via a signal line (300); an electrically conductive first shell (110) through which a terminal portion (201) of the circuit board (200) is inserted and that is electrically connected to the external circuit board (30) via the mating connector (20); and an electrically conductive second shell (120) that covers at least a portion of a target region that is a region, of one main surface (205) of the circuit board (200), other than the terminal portion (201). The abutting member (40) presses at least a portion of the connector (10) toward the external circuit board (30).

20 Claims, 16 Drawing Sheets

(51) Int. Cl.
*H01R 12/73* (2011.01)
*H05K 1/18* (2006.01)

(58) Field of Classification Search
USPC .......................................................... 439/55
See application file for complete search history.

(56) References Cited

U.S. PATENT DOCUMENTS

| | | | | |
|---|---|---|---|---|
| 7,682,179 | B1* | 3/2010 | Tsai | H01R 12/7005 |
| | | | | 439/328 |
| 10,264,675 | B2* | 4/2019 | Herring | H05K 1/141 |
| 10,290,962 | B2* | 5/2019 | Harmon, III | H01R 12/716 |
| 10,297,963 | B2* | 5/2019 | Herring | H01R 27/02 |
| 10,312,633 | B2* | 6/2019 | Tryson | H01R 12/716 |
| 10,367,282 | B2* | 7/2019 | Harmon, III | H01R 13/62988 |
| 10,490,919 | B2* | 11/2019 | Herring | H01R 12/716 |
| 11,171,432 | B2* | 11/2021 | Parkes | G02B 6/4277 |
| 11,177,603 | B2* | 11/2021 | Hashimoto | H01R 31/06 |
| 11,196,195 | B2* | 12/2021 | Bettman | H01R 12/73 |
| 11,956,886 | B2* | 4/2024 | Hashimoto | G02B 6/428 |
| 2003/0017726 | A1 | 1/2003 | Pupkiewicz et al. | |
| 2010/0120268 | A1* | 5/2010 | Yeh | H05K 7/1007 |
| | | | | 439/74 |
| 2012/0088388 | A1 | 4/2012 | Okano et al. | |
| 2013/0023134 | A1 | 1/2013 | Lin | |
| 2014/0295686 | A1 | 10/2014 | Ohnuki et al. | |
| 2014/0349514 | A1 | 11/2014 | Yang et al. | |
| 2015/0364865 | A1* | 12/2015 | Sutter | H01R 12/7076 |
| | | | | 439/345 |
| 2016/0336668 | A1 | 11/2016 | Kim et al. | |
| 2017/0164518 | A1 | 6/2017 | Morgan et al. | |
| 2018/0076587 | A1* | 3/2018 | Herring | H01R 27/02 |
| 2018/0233848 | A1 | 8/2018 | Lin et al. | |
| 2019/0174618 | A1 | 6/2019 | Chen et al. | |
| 2019/0179093 | A1 | 6/2019 | Little et al. | |
| 2019/0334276 | A1 | 10/2019 | Ichikawa et al. | |
| 2020/0185849 | A1* | 6/2020 | Chi | H01R 12/79 |
| 2020/0220286 | A1* | 7/2020 | Bettman | H01R 13/502 |

FOREIGN PATENT DOCUMENTS

| | | |
|---|---|---|
| CN | 103858285 A | 6/2014 |
| CN | 104183962 A | 12/2014 |
| CN | 107041101 A | 8/2017 |
| CN | 107658642 A | 2/2018 |
| CN | 108306129 A | 7/2018 |
| JP | 2003051347 A | 2/2003 |
| JP | 2003-308905 A | 10/2003 |
| JP | 2009-272256 A | 11/2009 |
| JP | 4613484 B2 | 1/2011 |
| JP | 2015-222638 A | 12/2015 |
| JP | 2017-500712 A | 1/2017 |
| JP | 2017-195032 A | 10/2017 |
| JP | 2019192861 A | 10/2019 |
| TW | 201112521 A | 4/2011 |
| TW | M426899 U | 4/2012 |
| TW | M561980 U | 6/2018 |

* cited by examiner

CONNECTOR AND CONNECTOR SYSTEM

CROSS-REFERENCE TO RELATED APPLICATIONS

This application is a U.S. National Phase Application of International Patent Application No. PCT/JP2021/016859, filed Apr. 27, 2021, which claims the benefit of JP Patent Application No. 2020-081320, filed May 1, 2020, the disclosures of which are hereby incorporated by reference in their entirety.

TECHNICAL FIELD

The present disclosure relates to a connector and a connector system.

BACKGROUND ART

The size of detachable connectors used in devices such as servers is increasing as the speed of communication of servers and the like increases. In response to this, Patent Literature 1 proposes a connector to reduce the size of the connector. This connector is fixed to a mating connector only at a mating portion, and an entirety of a receiving circuit board fixed to a mount is covered by an electrically conductive shield case. Due to this, heat can be transferred to the shield case via the mount.

CITATION LIST

Patent Literature

Patent Literature 1: Japanese Patent No. 4613484

SUMMARY OF INVENTION

Technical Problem

With the exception of the mating portion, the connector described in Patent Literature 1 is covered by outside air. Accordingly, this connector dissipates the majority of the heat to the outside air via the shield case. However, since the thermal conductivity of air is low, heat builds up in the shield case, and it cannot be said that sufficient heat dissipation is carried out.

The present disclosure is made with the view of the above situation, and an objective of the present disclosure is to provide a detachable connector and connector system that have high heat dissipation effects.

Solution to Problem

A connector according to a first aspect of the present disclosure that achieves the objective described above includes
  a connector that detachably mates with a mating connector mounted on an external circuit board; and
  an abutting member fixed to the external circuit board, wherein
  the connector includes a circuit board that connects to an external device via a signal line, an electrically conductive first shell through which a terminal portion of the circuit board is inserted and that is electrically connected to the external circuit board via the mating connector, and an electrically conductive second shell that covers at least a portion of a target region that is a region, of one main surface of the circuit board, other than the terminal portion, and
  the abutting member presses at least a portion of the connector toward the external circuit board.

The abutting member may detachably fix a position of the connector to the external circuit board, the position being closer to an end opposite the terminal portion than to the terminal portion.

The connector may further include a thermally conductive third shell that, in a state in which the connector is fixed to a main surface of the external circuit board, is fixed to the main surface of the external circuit board due to a portion of the second shell being pressed by the abutting member, and covers at least a portion of a target region that is a region, of another main surface of the circuit board, other than the terminal portion.

The abutting member may cover at least a portion of a target region that is a region, of another main surface of the circuit board, other than the terminal portion.

The abutting member may include a contactor that contacts the other main surface of the circuit board.

The contactor may contact the circuit board at a position opposing, across the circuit board, a heat generating member disposed on the circuit board.

The circuit board may be fixed to the second shell.

The abutting member may include a presser that presses the second shell toward the external circuit board and fixes the second shell, the second shell may include an engager with which the presser engages, and a plurality of each of the presser and the engager may be formed aligned in a direction crossing a direction in which the signal line extends.

The abutting member may include a presser that presses the second shell toward the external circuit board and fixes the second shell, and be fixed to the external circuit board by a fixer provided at at least a position directly below the presser or at a peripheral position of the position directly below.

A plurality of each of the presser and the engager may be formed aligned in the direction in which the signal line extends.

A connector according to a second aspect of the present disclosure that achieves the objective described above is a connector that detachably mates with a mating connector mounted on an external circuit board, the connector including a circuit board that connects to an external device via a signal line; an electrically conductive first shell through which a terminal portion of the circuit board is inserted and that is electrically connected to the external circuit board via the mating connector; and an electrically conductive second shell that covers at least a portion of a target region that is a region, of one main surface of the circuit board, other than the terminal portion, wherein the connector is detachably installed on of the external circuit board by an abutting member fixed to the external circuit board.

Advantageous Effects of Invention

According to the present disclosure, a detachable connector and connector system that have high heat dissipation effects can be provided.

DESCRIPTION OF EMBODIMENTS

Figure 1A:
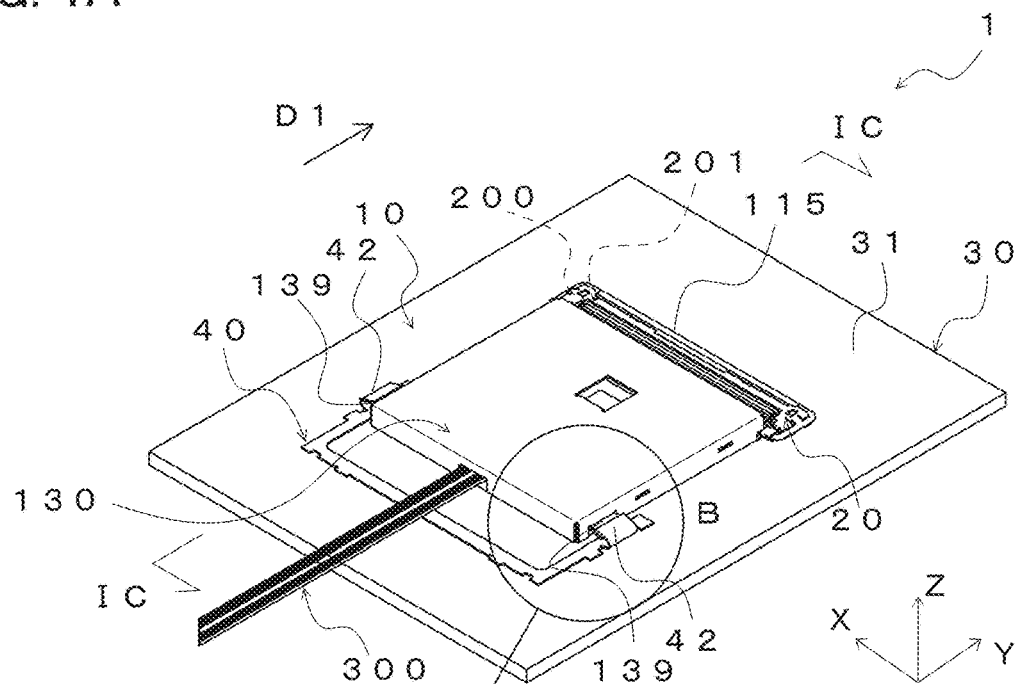
FIG. 1A is a perspective view of a connector system according to Embodiment 1 of the present disclosure.

Hereinafter, a connector system provided with a connector according to various embodiments of the present disclosure is described while referencing the drawings. In the drawings, XYZ coordinates that are orthogonal to each other are set and appropriately referenced. As illustrated in FIG. 1A, the Y-axis direction of the XYZ coordinates is the same direction (front-back direction) as a mating direction D1 in which a connector 10 moves in order to mate with a mating connector 20. The Z-axis direction is the same direction (up-down direction) as a thickness direction of a circuit board 200 of the connector 10. The X-axis direction is a direction (width direction) orthogonal to both the Y-axis direction and the Z-axis direction. Note that identical constituents are denoted with the same reference numerals.

Embodiment 1

As illustrated in FIG. 1, a connector system 1 is an active optical cable (AOC) connector unit that is used in, for example, a graphic processing unit (GPU), a field programmable gate array (FPGA), or the like in a server. The connector system 1 according to Embodiment 1 includes a connector 10 that detachably mates with a mating connector 20 connected to an external circuit board 30, and an abutting member 40 disposed on the external circuit board 30.

The connector 10 is a male connector that connects to the mating connector 20 that is a female connector.

Figure 2:
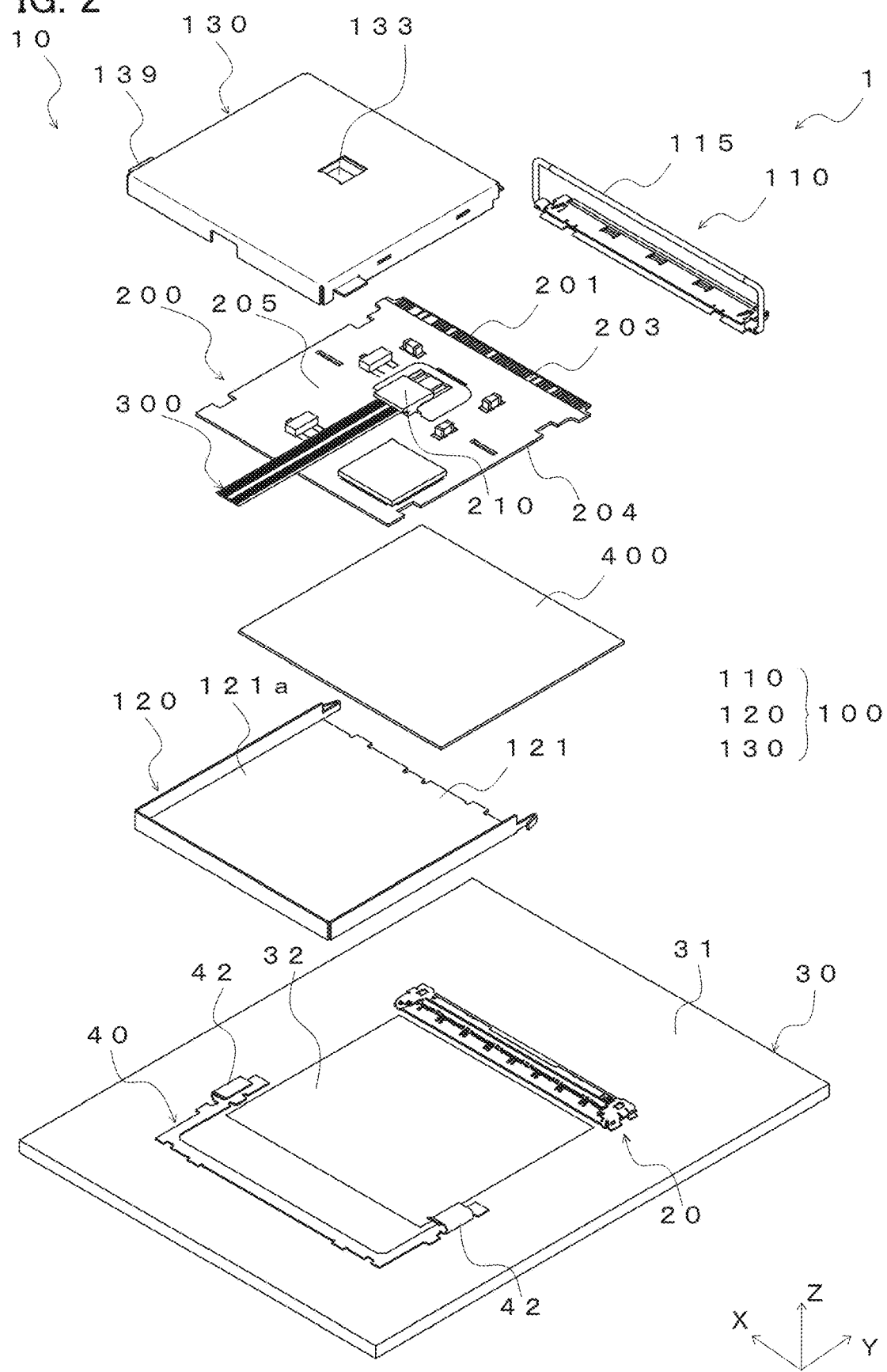
FIG. 2 is an exploded perspective view of the connector system according to Embodiment 1 of the present disclosure.

As illustrated in the exploded perspective view of the connector system 1 of FIG. 2, the connector 10 includes a circuit board 200 on which a printed circuit is formed, a semiconductor device 210 disposed on the circuit board 200, a signal line 300 connected to the semiconductor device 210, and a housing 100 that houses the circuit board 200, except a terminal portion 201, and a base of the signal line 300.

Meanwhile, the mating connector 20 illustrated in FIG. 1A and FIG. 2 connects to a connection terminal 203 arranged on the terminal portion 201 of the circuit board 200. The external circuit board 30 sends/receives, via the mating connector 20, electrical signals to/from an external device or the like connected to the connector 10. The abutting member 40 detachably fixes the connector 10, which is mated with the mating connector 20, in a state contacting a main surface 31 of the external circuit board 30.

The connector 10 receives an optical signal via the signal line 300, converts the optical signal to an electrical signal by the semiconductor device 210 mounted on the circuit board 200, and processes the electrical signal. Then, the connector 10 sends the electrical signal to the mating connector 20 via the printed circuit on the circuit board 200 and the connection terminal 203 arranged on the terminal portion 201. Additionally, the connector 10 transmits an electrical signal sent from the mating connector 20 to the semiconductor device 210 via the connection terminal 203 arranged on the terminal portion 201 and the printed circuit. Then, the electrical signal is processed by the semiconductor device 210, converted to an optical signal, and the optical signal is sent out via the signal line 300.

Next, the configuration of the connector 10 is described in detail.

In one example, the housing 100 constituting the exterior of the connector 10 is an electrically conductive member formed from a metal. The housing 100 houses the circuit board 200, except for the terminal portion 201. The housing 100 includes a front shell 110 that allows the terminal portion 201 of the circuit board 200 to protrude, a lower shell 120 that fixes a lower portion of the circuit board 200, and an upper shell 130 disposed on an upper portion of the circuit board 200. The front shell 110 is an example of the first shell, the lower shell 120 is an example of the third shell, and the upper shell 130 is an example of the second shell.

The front shell 110 is a member that allows the terminal portion 201 of the circuit board 200 to protrude out (forward from) the housing 100, and that covers the circuit board 200. As schematically illustrated in FIGS. 3A to 3D, the front shell 110 includes a rectangular tube-shaped main body 111 and a substantially C-shaped lock bar 115 rotatably locked to both X-axis direction ends of the main body 111. The front shell 110 allows the terminal portion 201 to be inserted through, and to electrically connect to the external circuit board 30 via the mating connector 20.

Figure 11A:
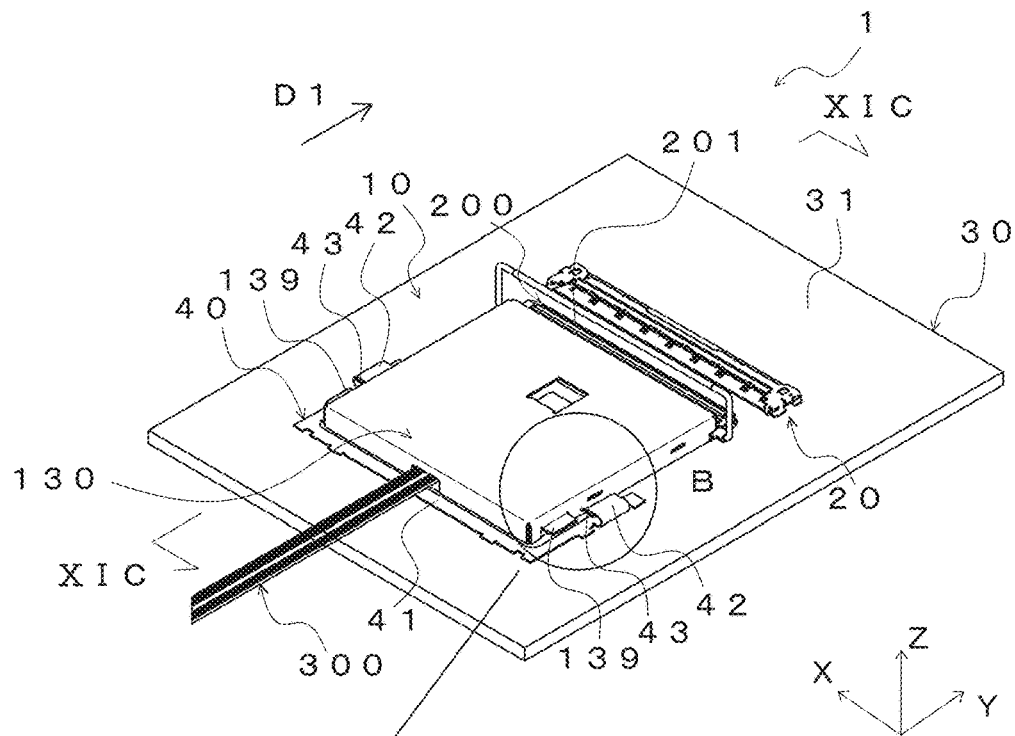
FIG. 11A is a perspective view prior to mating the connector according to Embodiment 1 of the present disclosure with a mating connector.

The main body 111 constitutes a main body portion of the front shell 110, and an insertion section 111a penetrating in the Y-axis direction (the front-back direction) is formed in the main body 111. The insertion section 111a corresponds to a hollow portion. As illustrated in FIG. 9B and FIG. 11A, a front end (one end) 117 of the main body 111 mates with the mating connector 20 together with the terminal portion 201 of the circuit board 200. As illustrated in FIG. 3F, a rear end (other end) 118 of the main body 111 is formed so as to spread in the Z-axis direction (the up-down direction). This is to secure space for inserting the circuit board 200 through the front shell 110. Additionally, as illustrated in FIGS. 3F and 9B, the main body 111 includes an opposing section 111b that opposes a hereinafter described other main surface 204 of the circuit board 200, a cover section 111c opposing a hereinafter described one main surface 205 of the circuit board 200, and a connection section 111d that connects the opposing section 111b and the cover section 111c. The opposing section 111b and the cover section 111c are disposed opposing each other in a state separated in the Z-axis direction (the up-down direction). The connection section 111d connects a +Y direction (front direction) end of the opposing section 111b to a +Y direction (front direction) end of the cover section 111c. The connection section 111d is provided on each of both X-axis direction ends of the front end 117 of the main body 111. The insertion section 111a is formed, at the front end (the one end) 117 of the main body 111, by a space surrounded by the opposing section 111b, the cover section 111c, and the connection section 111d.

Figure 9A:
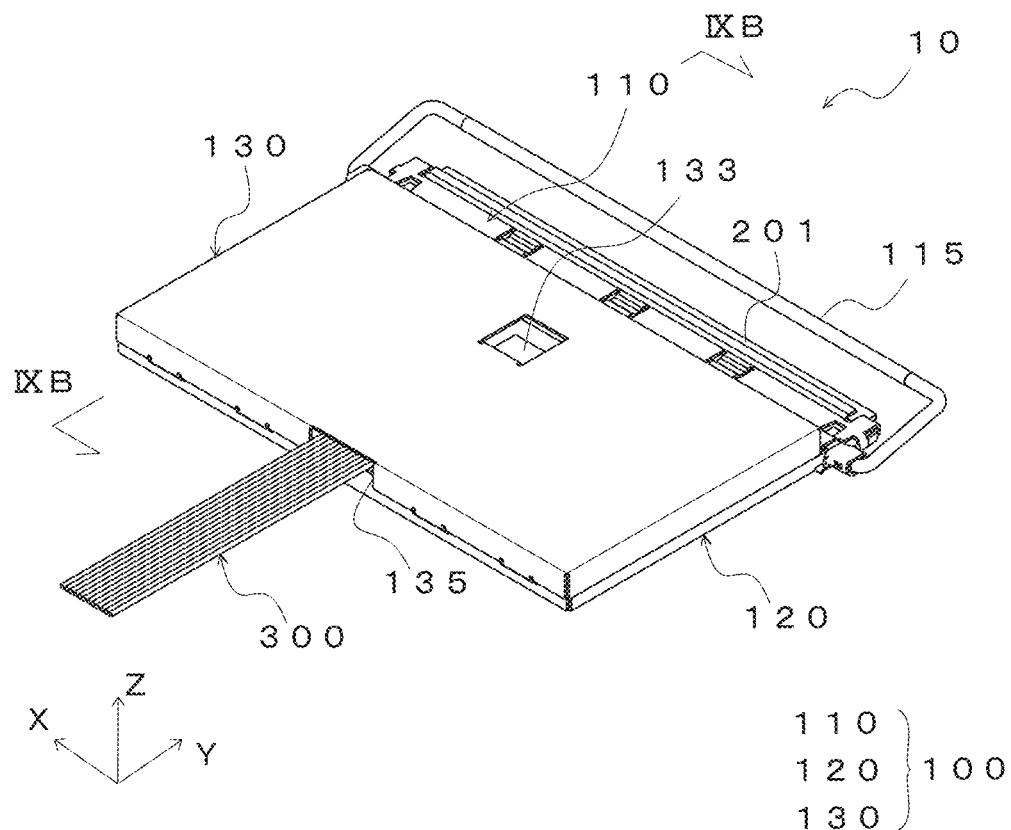
FIG. 9A is a perspective view of a connector according to Embodiment 1 of the present disclosure.
Figure 9B:
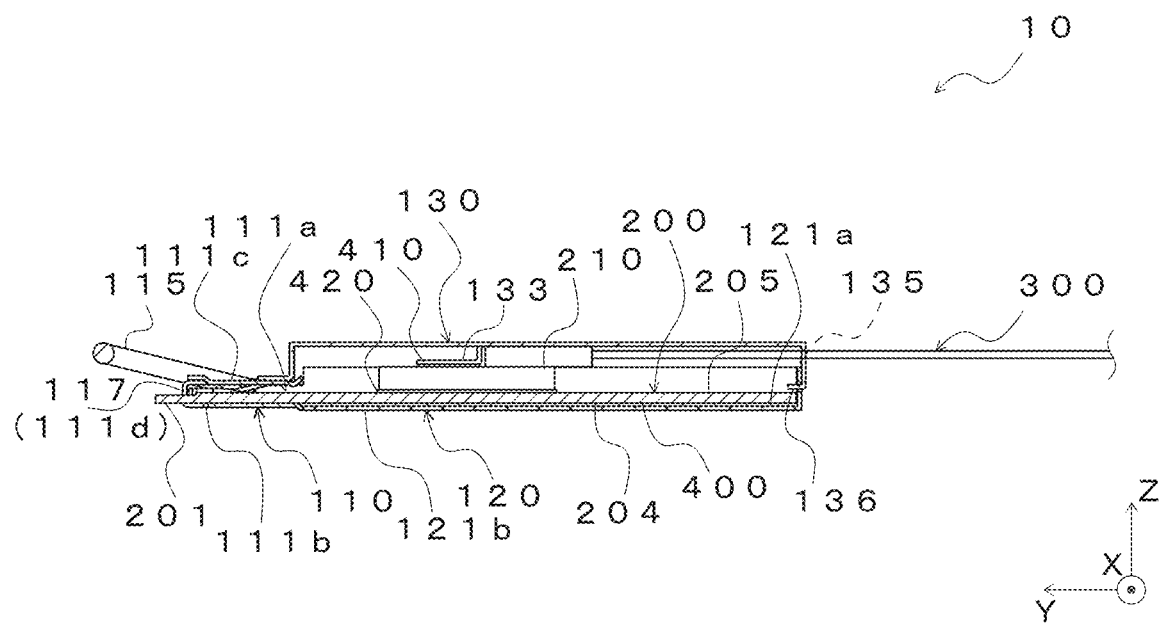
FIG. 9B is a cross-sectional view of the connector, taken along line IXB-IXB of FIG. 9A.

As illustrated in FIGS. 9A and 9B, the terminal portion 201 of the circuit board 200 is inserted through the insertion section 111a, and the terminal portion 201 protrudes from the front end 117 of the front shell 110.

Figure 3A:
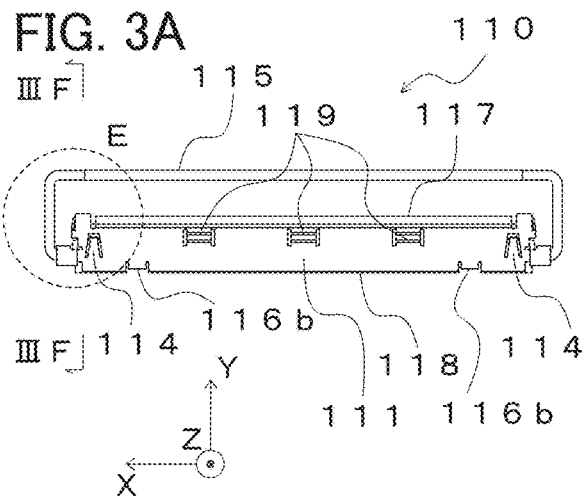
FIG. 3A is a plan view of a front shell according to Embodiment 1 of the present disclosure.
Figure 3D:
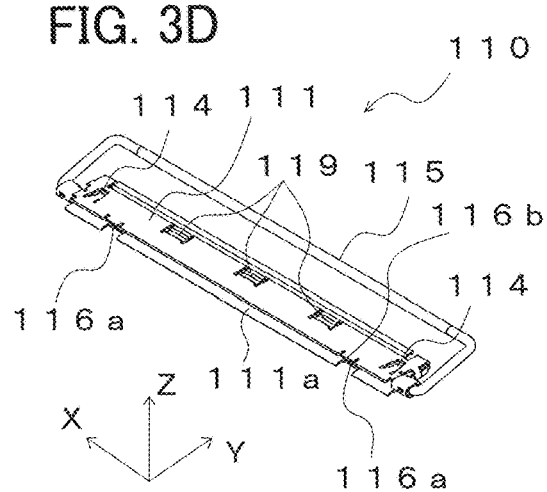
FIG. 3D is a perspective view of the front shell according to Embodiment 1 of the present disclosure.
Figure 3B:
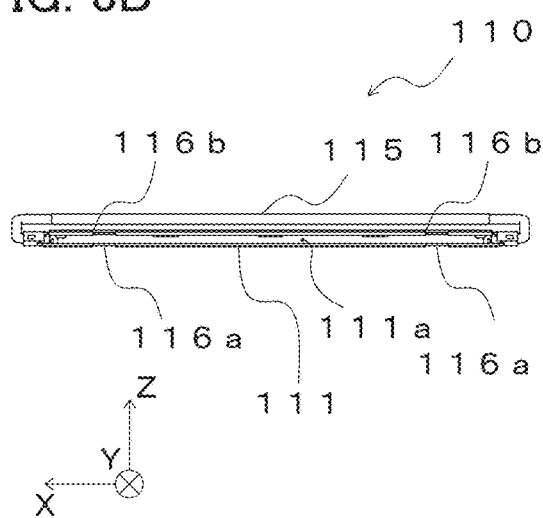
FIG. 3B is a back view of the front shell according to Embodiment 1 of the present disclosure.
Figure 3E:
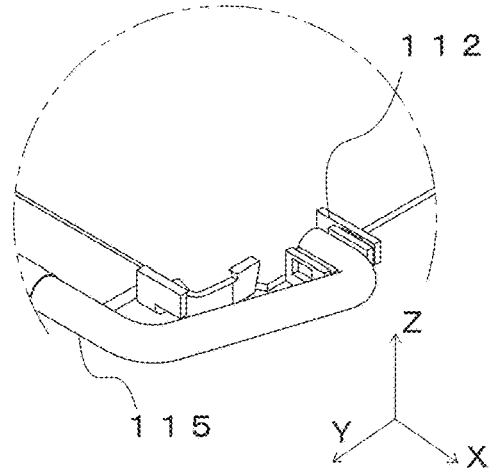
FIG. 3E is an enlarged perspective view of section E of FIG. 3A, in which a main body on a +Z side is omitted.

As illustrated in FIG. 3A and FIG. 3E that is an enlarged view of section E of FIG. 3A, an engaged portion 112 is formed on both X-axis direction (width direction) ends of the main body 111. The engaged portion 112 is a plate-like member that has a main surface on the XZ plane. A hereinafter described engager 123 of the lower shell 120 engages with the engaged portion 112.

Figure 3C:
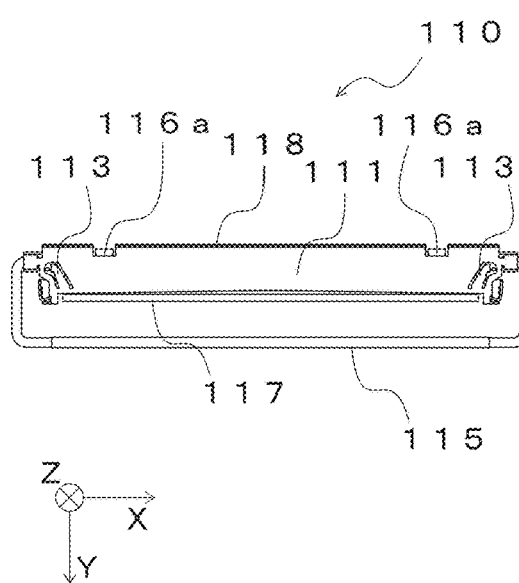
FIG. 3C is a bottom view of the front shell according to Embodiment 1 of the present disclosure.
Figure 3F:
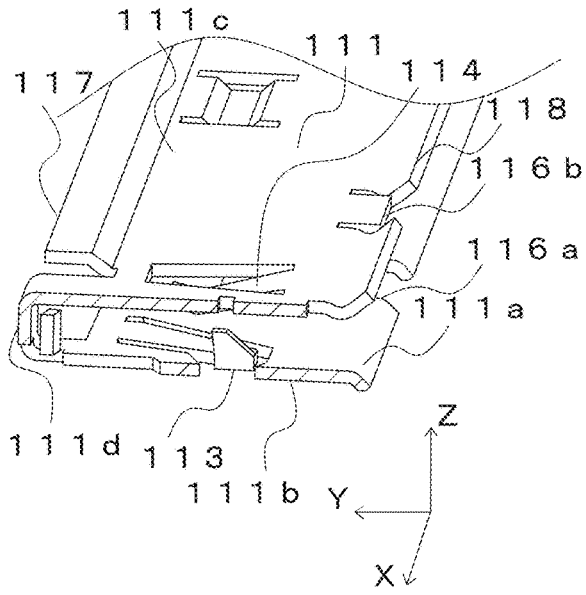
FIG. 3F is a cross-sectional view of the front shell, taken along line IIIF-IIIF of FIG. 3A.

As illustrated in FIGS. 3C and 3F, an engaging claw 113 is formed near both X-axis direction (width direction) ends of the main body 111. The engaging claw 113 is a hook-like member that protrudes into the insertion section 111a. The engaging claw 113 engages with a hereinafter described protrusion 202 of the circuit board 200 inserted into the insertion section 111a, and prevents the circuit board 200 from falling out from the front shell 110.

As illustrated in FIGS. 3A, 3D, and 3F, a press-stopper 114 is formed near both X-axis direction (width direction) ends of an upper wall of the main body 111. The press-stopper 114 presses and stops the circuit board 200 inserted into the insertion section 111a. The press-stopper 114 is formed from an L-shaped tongue that protrudes, with elasticity, from the main body 111 toward the interior of the insertion section 111a. As a result, the press-stopper 114 press-stops, in the −Z direction, the circuit board 200 inserted through the insertion section 111a.

As illustrated in FIGS. 3C and 3D, a soldering portion 116a is formed on the −Z side (lower side) of the rear end 118 of the main body 111. When viewed on the XY plane, the soldering portion 116a has a recessed portion. Shifting in the Y-axis direction (the front-back direction) of the front shell 110 and the lower shell 120 is suppressed due to a hereinafter described protrusion 125 of the lower shell 120 being disposed in the recessed portion of the soldering portion 116a. Additionally, a gap between the soldering portion 116a and the protrusion 125 is soldered, and the front shell 110, the lower shell 120, and the circuit board 200 are fixed to each other.

Note that the soldering portion 116a and the protrusion 125 need not necessarily be soldered.

Figure 4:
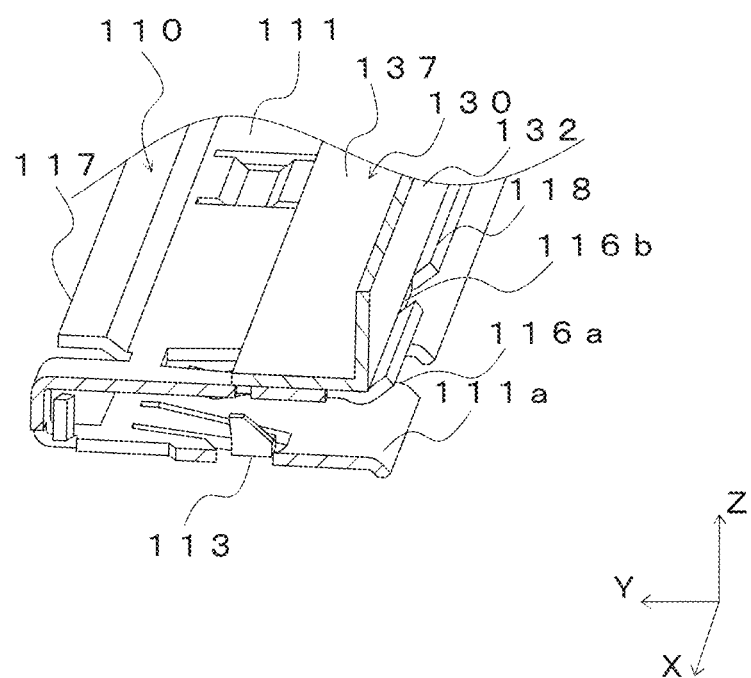
FIG. 4 is a drawing in which a portion of an upper shell is disposed in the enlarged cross-sectional view illustrated in FIG. 3F.

As illustrated in FIGS. 3A, 3D, and 3F, an abutter 116b is formed on the +Z side (the upper side) of the rear end 118 of the main body 111. The abutter 116b has a plate-like tongue piece, and the tongue piece is near the one main surface 205 of the circuit board 200. When attaching the upper shell 130 to the front shell 110, as illustrated in FIG. 4, the tongue piece of the abutter 116b of the front shell 110 abuts against the Y-direction (front direction) end of a hereinafter described abutter 137 of the upper shell 130.

As illustrated in FIGS. 3A and 3D, a recess 119 is provided on the +Z side (the upper side) of the front end 117 of the main body 111. The recess 119 is recessed in the −Z direction (the down direction). Due to the recessing of the recess 119, wobbling of the circuit board 200 disposed in the front shell 110 can be suppressed.

Figure 1B:
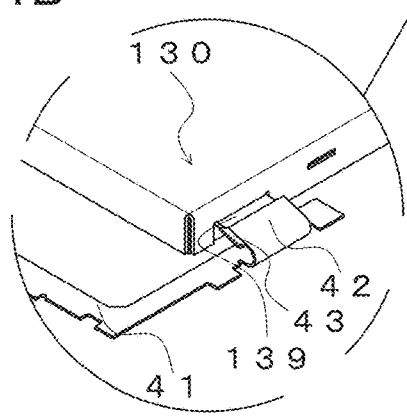
FIG. 1B is an enlarged perspective view of section B of the connector system illustrated in FIG. 1A.
Figure 1C:
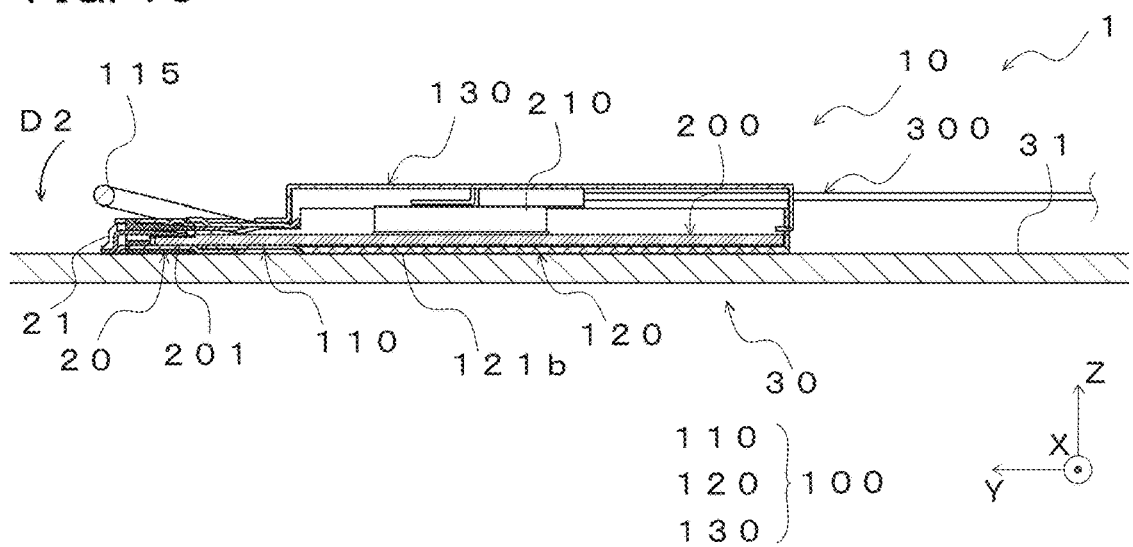
FIG. 1C is a cross-sectional view of the connector system, taken along line IC-IC of FIG. 1A.

As illustrated in FIG. 3E, the lock bar 115 is a substantially C-shaped member that engages with both X-axis direction (width direction) ends of the main body 111. Furthermore, the lock bar 115 engages with the engaged portions 112 and is in a rotatable state due to both ends of the lock bar 115 being positioned between the opposing section 111b and the cover section 111c in the Z-axis direction. As illustrated in FIG. 1C, in a state in which the terminal portion 201 of the circuit board 200 is connected to the mating connector 20, the lock bar 115 is rotated/moved in a D2 direction and hooks on a +Y direction (front direction) wall surface 21 of the mating connector 20. As a result, the lock bar 115 prevents the connector 10 from detaching from the mating connector 20.

Figure 5A:
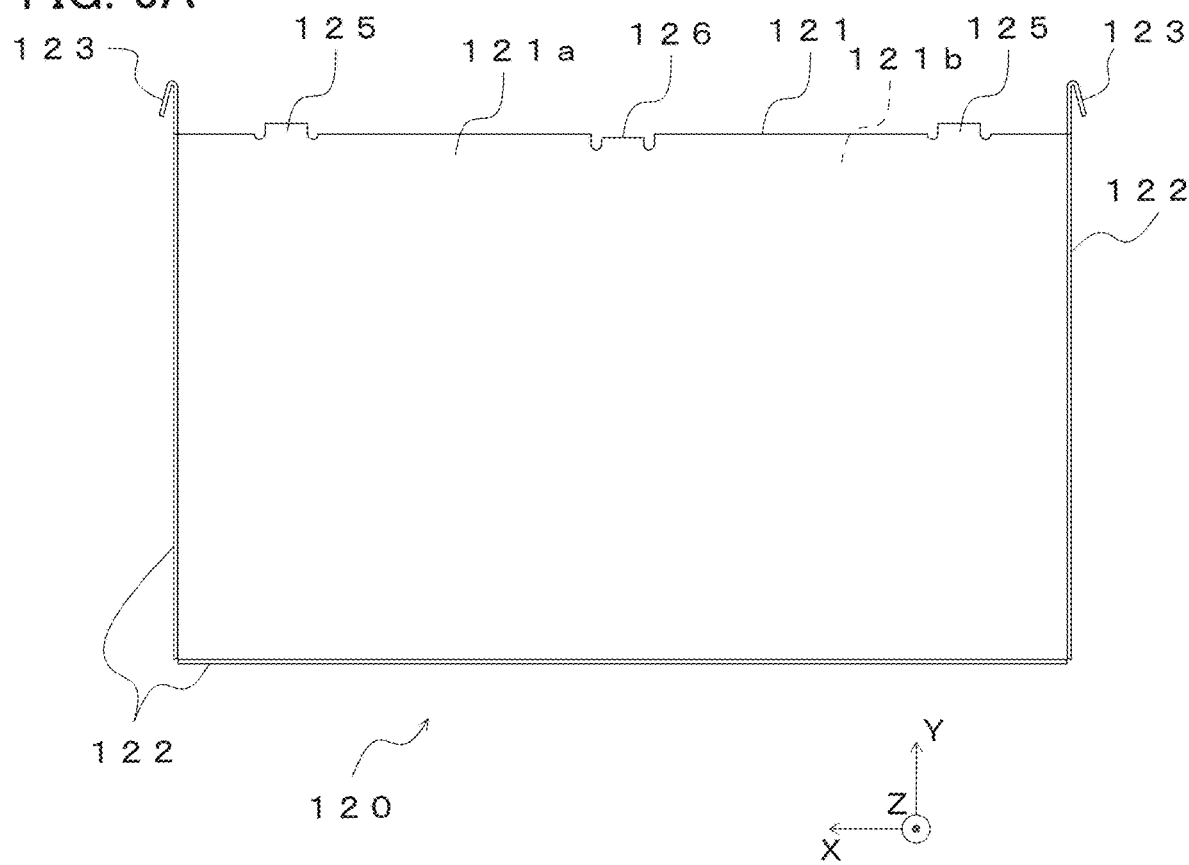
FIG. 5A is a plan view of a lower shell according to Embodiment 1 of the present disclosure.
Figure 5B:
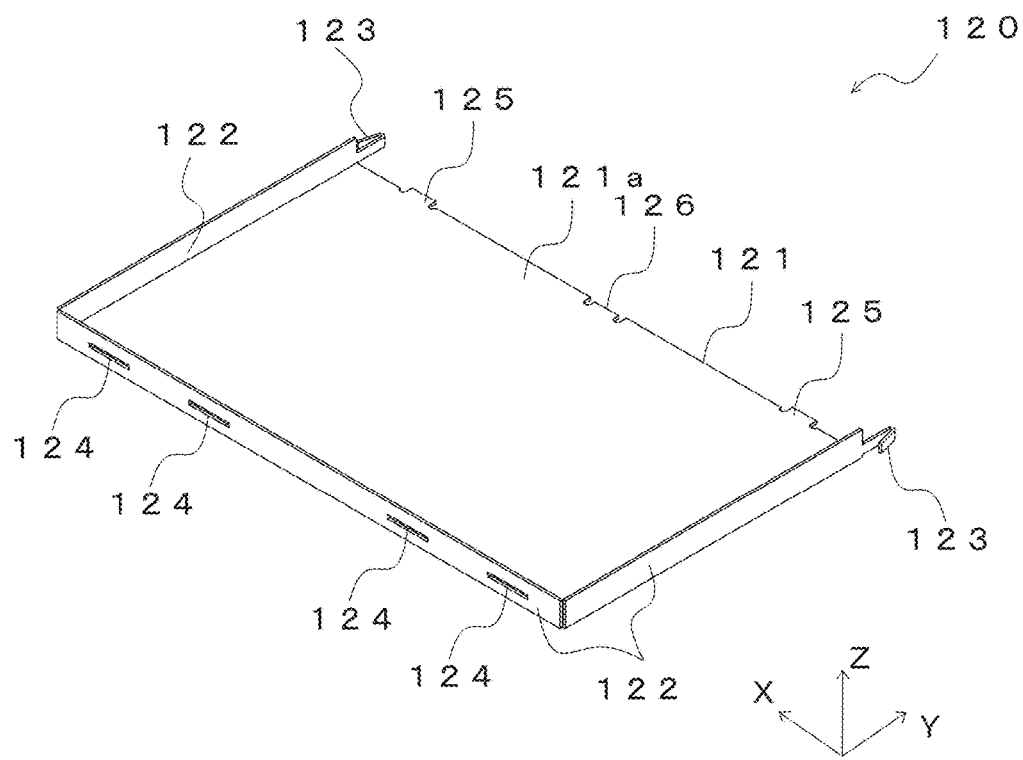
FIG. 5B is a perspective view of the lower shell according to Embodiment 1 of the present disclosure.

Meanwhile, as illustrated in FIGS. 5A and 5B, the lower shell 120 of the housing 100 includes a base 121, a riser 122, and a pair of engagers 123. The lower shell 120 is a member that covers at least a portion of a target region that is a region of the circuit board 200 other than the terminal portion 201, and that also supports the circuit board 200.

The base 121 is a flat plate-like member that has a substantially rectangular shape. The circuit board 200 is disposed on a main surface 121a of the base 121 via a hereinafter described fixing material 400.

A pair of protrusions 125 is formed on a +Y direction (front) end of the base 121. The protrusion 125 is a flat plate-like member that, when the lower shell 120 is engaged with the front shell 110, is disposed in the recessed portion of the soldering portion 116a provided on the −Z side (the lower side) of the rear end 118 of the front shell 110.

A soldering portion 126 is formed at a +Y direction (front) center section of the base 121. The soldering portion 126 includes a recess for fixing, by solder, the front shell 110, the lower shell 120, and the circuit board 200.

The riser 122 is a member that forms a wall that rises from both X direction ends and the −Y direction end (rear and sides) of the base 121.

A plurality of engaging holes 124 is formed in the −Y direction end (rear end) riser 122. The engaging holes 124 are each formed in a substantially rectangular shape. A hereinafter described engager 136 of the upper shell 130 engages with each of the engaging holes 124.

The engagers 123 are hook-like members that are formed on the +Y direction end (front end) of the risers 122 of both X-axis direction ends (both width direction ends). The engagers 123 engage with the engaged portions 112 while the lower shell 120 is connected to the front shell 110. The hook-like portions of the pair of engagers 123 are formed facing outward, and the pair of engaged portions 112 is formed on the outside of the engagers 123. As such, a structure is obtained in which, when the engagers 123 are engaged with the engaged portions 112, these portions are not easily disengaged.

Figure 6A:
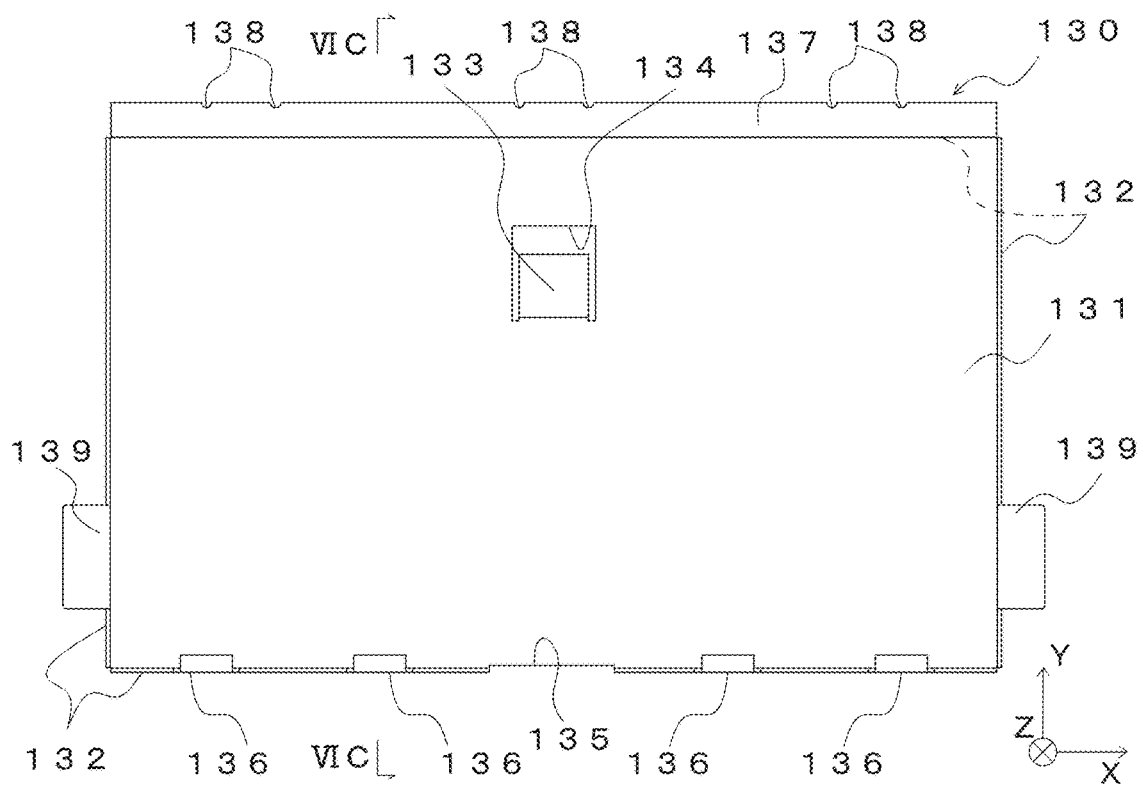
FIG. 6A is a bottom view of the upper shell according to Embodiment 1 of the present disclosure.
Figure 6B:
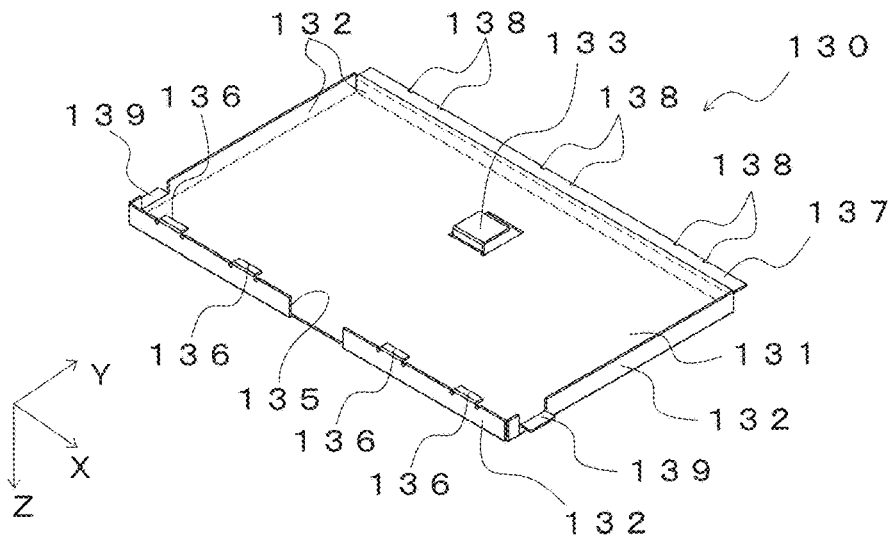
FIG. 6B is a perspective view of the upper shell according to Embodiment 1 of the present disclosure.
Figure 6C:
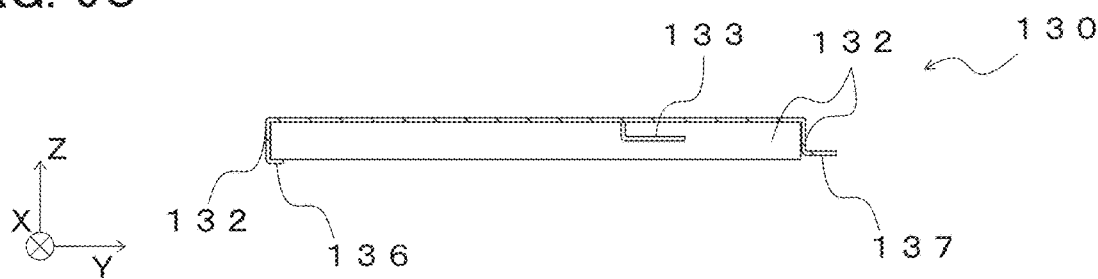
FIG. 6C is a cross-sectional view of the upper shell, taken along line VIC-VIC of FIG. 6A.

As illustrated in FIGS. 6A to 6C, the upper shell 130 of the housing 100 includes a base 131, a riser 132, a tongue 133, an abutter 137, and an engager 139. The upper shell 130 covers at least a portion of the target region (region other than the terminal portion 201) of the circuit board 200.

The base 131 is a flat plate-like member that has a substantially rectangular shape in which a slit is formed near the center to form the tongue 133. A length of a short side and a length of the long side of the base 131 of the upper shell 130 are respectively slightly longer than a length of the short side and a length of the long side of the base 121 of the lower shell 120. As a result, the upper shell 130 can accommodate the upper end of the riser 122 of the lower shell 120.

When viewed on the XY plane, the tongue 133 is a substantially square shape member formed bent from the base 131 in the −Z direction (down direction, direction in which the semiconductor device 210 is disposed). The tongue 133 is a member for facilitating the hereinafter described heat dissipation of the semiconductor device 210 of the circuit board 200. A gap 134 is formed between the base 131 and the tongue 133, and air in the housing 100 that is heated by the semiconductor device 210 is released out through the gap 134.

The riser 132 is a member that forms a wall surface that rises from the four edges of both X direction ends and both Y direction ends of the base 131. The X direction ends and the −Y direction end (the width direction and the rear direction) of the riser 132 of the upper shell 130 are disposed overlapping both X direction ends and the −Y direction end (the width direction and the rear direction) of the riser 122 of the lower shell 120.

Figure 7A:
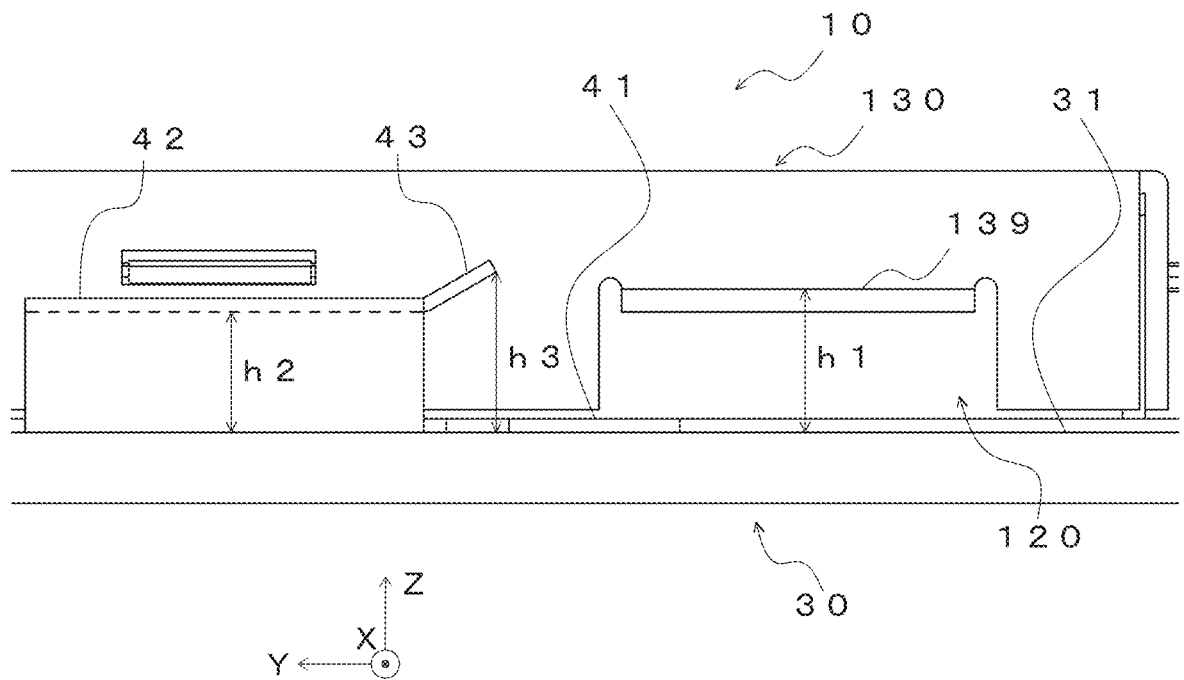
FIG. 7A is an enlarged side view of the connector system according to Embodiment 1 of the present disclosure.
Figure 7B:
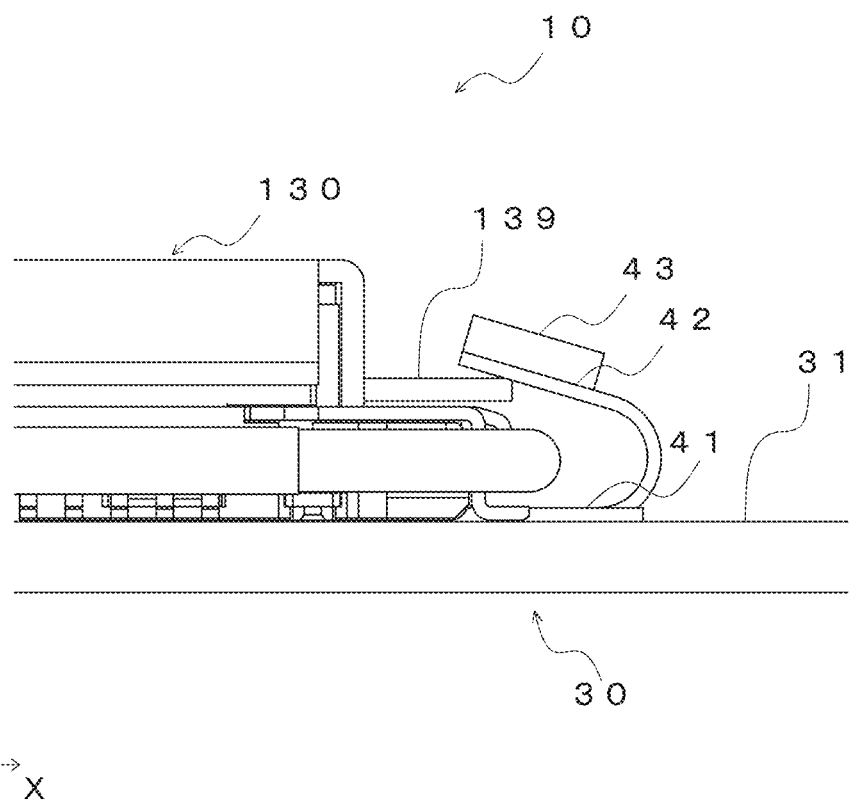
FIG. 7B is an enlarged front view of the connector system according to Embodiment 1 of the present disclosure.

The engager 139 is formed in a substantially rectangular shape near the −Y direction end of the +X and −X direction (left-right direction) walls of the riser 132. The engager 139 is a member with which a hereinafter described presser 42 of the abutting member 40 engages, and is for pressing the entire connector 10 against the external circuit board 30. The engager 139 is formed by bending a portion of the riser 132 back toward the outside of the connector 10, so as to be substantially horizontal with respect to the base 131. As illustrated in FIG. 7A, when the connector 10 is disposed on the main surface 31 of the external circuit board 30, a distance h1, from the main surface 31, of an upper surface of the engager 139 is set to be greater than a distance h2, from the main surface 31, of a lower surface of a hereinafter described presser 42, and less than a distance h3 where the distance, from the main surface 31, of a lower surface of a hereinafter described guide 43 is greatest. As illustrated in FIG. 7B, a width and a protruding length of the engager 139 are formed to sizes capable of engaging with the hereinafter described presser 42.

As illustrated in FIGS. 6A and 6B, an insertion port 135 for passing the signal line 300 is formed near the center of the −Y direction (rear direction) wall of the riser 132.

A plurality of housing engagers 136 is formed facing the +Y direction (the front direction) at the top (−Z direction end) of the −Y direction (rear direction) wall of the riser 132. Each of the housing engagers 136 is a substantially rectangular member. The housing engagers 136 engage with the engaging holes 124 formed on the riser 122 of the lower shell 120.

The abutter 137 is a plate-like member formed on the −Z direction end (the lower end) of the riser 132 of the +Y direction end (the front end). The abutter 137 of the upper shell 130 abuts against the +Z direction surface of the main body 111 of the front shell 110 and the abutter 116b of the front shell 110.

A plurality of concave recesses 138 is formed on the +Y direction (front direction) end of the abutter 137. While the abutter 137 of the upper shell 130 is abutted against the front shell 110, the adjacent recesses 138, 138 and the abutter 116b of the front shell 110 are soldered to fix the upper shell 130 to the front shell 110.

Note that the fixing of the abutter 137 and the front shell 110 may be carried out using a heat conductive adhesive instead of soldering, or abutting without fixing may be employed.

Figure 8A:
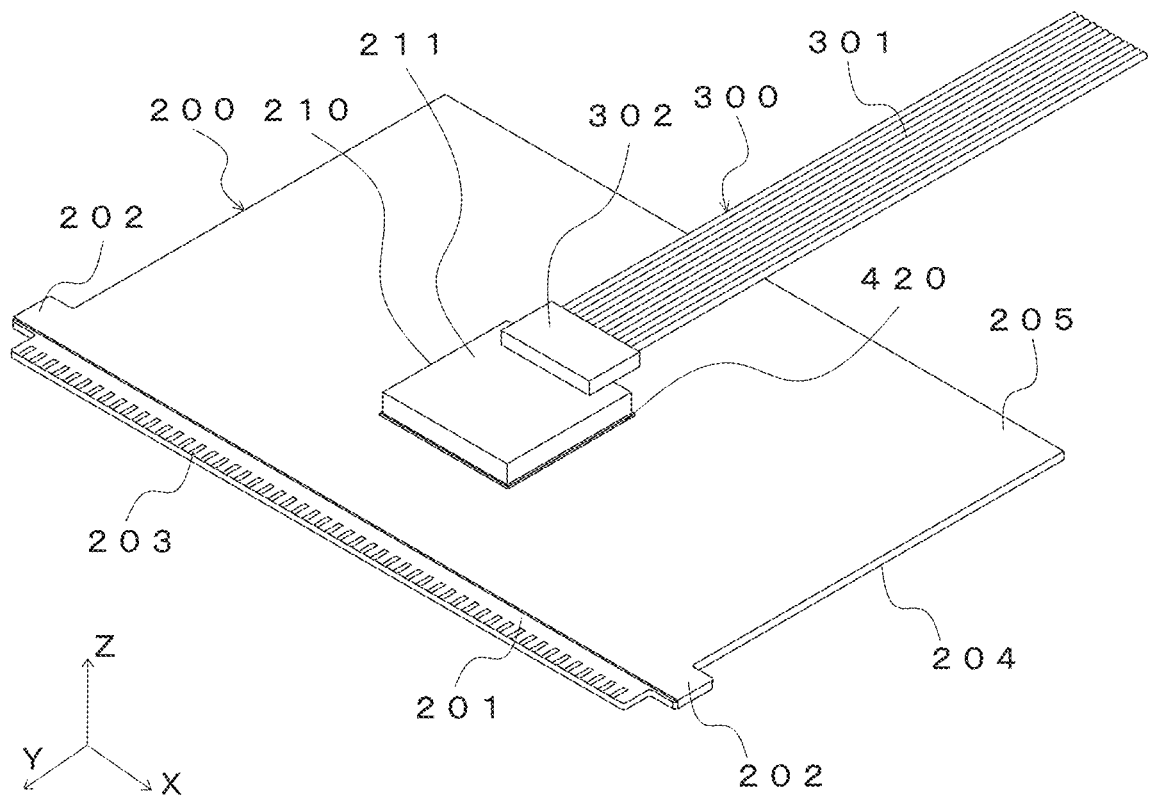
FIG. 8A is a perspective view of a circuit board according to Embodiment 1 of the present disclosure.
Figure 8B:
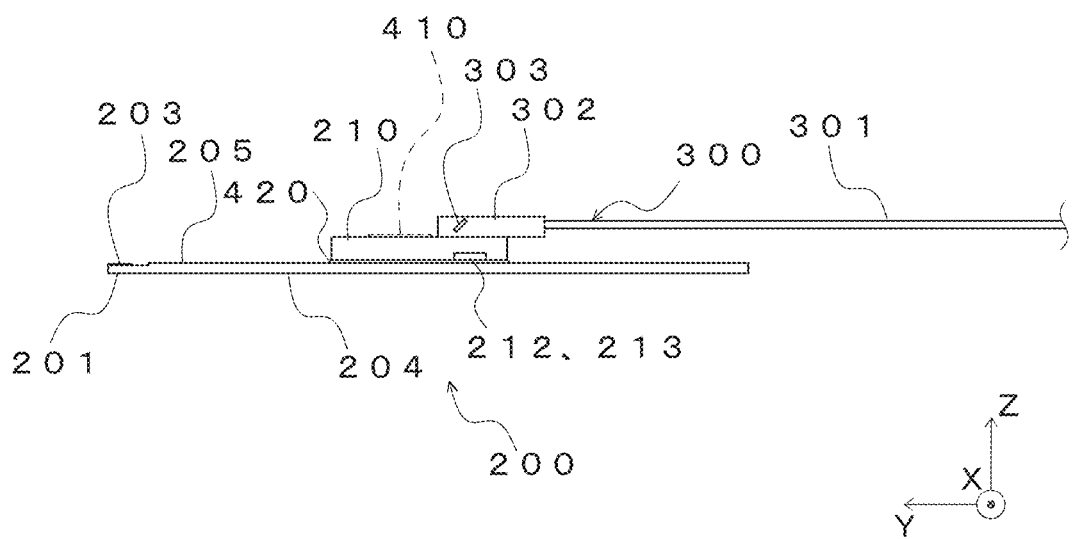
FIG. 8B is a side view of the circuit board according to Embodiment 1 of the present disclosure.

The circuit board 200 is an active optical cable (AOC) board and, as illustrated in FIGS. 8A and 8B, includes a pair of protrusions 202 and the connection terminal 203.

As illustrated in FIGS. 2 and 9B, the circuit board 200 is fixed on the main surface 121a of the lower shell 120 via the fixing material 400, and is connected in a thermally conductive manner to the lower shell 120.

As illustrated in FIGS. 8A and 8B, the terminal portion 201 is the +Y side (front side) end of the circuit board 200. The terminal portion 201 is a portion that protrudes from the front end 117 of the front shell 110 when the circuit board 200 is inserted, in the +Y direction (the front direction), through the front shell 110 from the rear end 118.

The protrusions 202 are portions that are formed protruding outward from both X-axis direction (width direction) ends of the terminal portion 201. While the circuit board 200 is inserted up to a predetermined position of the insertion section 111a, the protrusions 202 engage with the hook-like portions of the engaging claws 113, and prevent the circuit board 200 from falling out from the front shell 110.

A plurality of connection terminals 203 is formed on the one main surface 205 of the terminal portion 201. The connection terminals 203 connect to connection terminals of the mating connector 20.

The semiconductor device 210 is a heat generating member that includes a silicon photonics circuit, includes a light emitting element 212, a light receiving element 213, an electricity terminal, and the like, and is mounted on the circuit board 200. A laser diode (LD) as the light emitting element 212 for example, a photo diode (PD) as the light receiving element 213 for example, and other components such as a driver and the like are integrated in the silicon photonics circuit. An electricity terminal of the semiconductor device 210 is connected, via wiring formed on the circuit board 200, to the connection terminal 203 disposed on the terminal portion 201. As illustrated in FIG. 9B, the semiconductor device 210 is connected in a thermally conductive manner to the tongue 133 of the upper shell 130 via a heat transfer material 410. Additionally, the semiconductor device 210 is connected, via a heat transfer material 420, to the circuit board 200 in a thermally conductive manner, on the main surface 205 of the circuit board 200.

As illustrated in FIGS. 8A and 8B, the signal line 300 includes an optical fiber 301 and a connection member 302. One end of the optical fiber 301 is connected to the connection member 302, and another end is connected to an external component (an external device or the like). The connection member 302 is connected to the semiconductor device 210. A reflecting mirror 303 is disposed on the connection member 302. The reflecting mirror 303 reflects and bends the light emitted from the optical fiber 301 or the light emitted from the light emitting element 212. Due to the reflecting mirror 303, the semiconductor device 210 and the signal line 300 are connected in a manner that enables light to be transmitted.

The fixing material 400 is constituted from an adhesive that has higher thermal conductivity than general resin adhesives. For example, the fixing material 400 is constituted from silver paste. As illustrated in FIG. 9B, the fixing material 400 is filled between the other main surface 204 of the circuit board 200 and the main surface 121a of the base 121 of the lower shell 120, including directly below the semiconductor device 210. Note that, when wiring is also formed on the other main surface 204 of the circuit board 200, the surface of the wiring is subjected to insulation treatment. The fixing material 400 has a function of fixing the circuit board 200 to the lower shell 120, and a function of transferring the heat of the circuit board 200 to the lower shell 120 and dissipating the heat. Note that the fixing material 400 is not limited to a solid, and may be a sol, a gel, or the like. For example, heat-dissipating grease such as heat-transferring grease, a heat-dissipating sheet, or the like may be used.

The heat transfer materials 410 and 420 are thermally conductive members and, in the present embodiment, silver paste is used, for example. The heat transfer material 410 fulfills a function of transferring the heat generated in the semiconductor device 210 to the tongue 133 of the upper shell 130, thereby dissipating the heat using the entire upper shell 130. Meanwhile, the heat transfer material 420 fulfills a function of transferring the heat generated in the semiconductor device 210 to the circuit board 200 and transferring that heat from the circuit board 200 to the lower shell 120 via the fixing material 400, thereby dissipating the heat using the entire lower shell 120.

As illustrated in FIGS. 1 and 11, the mating connector 20 is a female connector mounted on the external circuit board 30. The terminal portion 201 of the circuit board 200 protruding from the connector 10 is inserted into the mating connector 20.

Note that it is sufficient that the mating connector 20 is provided with a configuration that corresponds to the connector 10. The configuration of the female connector illustrated in FIGS. 1 and 11 is an example, and the shape and the like of the mating connector 20 can be changed as appropriate.

In one example, the external circuit board 30 is constituted from a hard printed board obtained by forming a wiring pattern of copper foil on a board made from an epoxy-based resin material. Contacts and attachers (neither illustrated in the drawings) are exposed on the main surface 31 of the external circuit board 30. The mating connector 20 and the abutting member 40 are attached to the external circuit board 30. Additionally, as illustrated in FIG. 2, copper foil 32 is also disposed on the main surface 31 of the external circuit board 30 at the position of where the lower shell 120 abuts, and facilitates the transmission of heat from the connector 10 to the external circuit board 30.

Figure 10A:
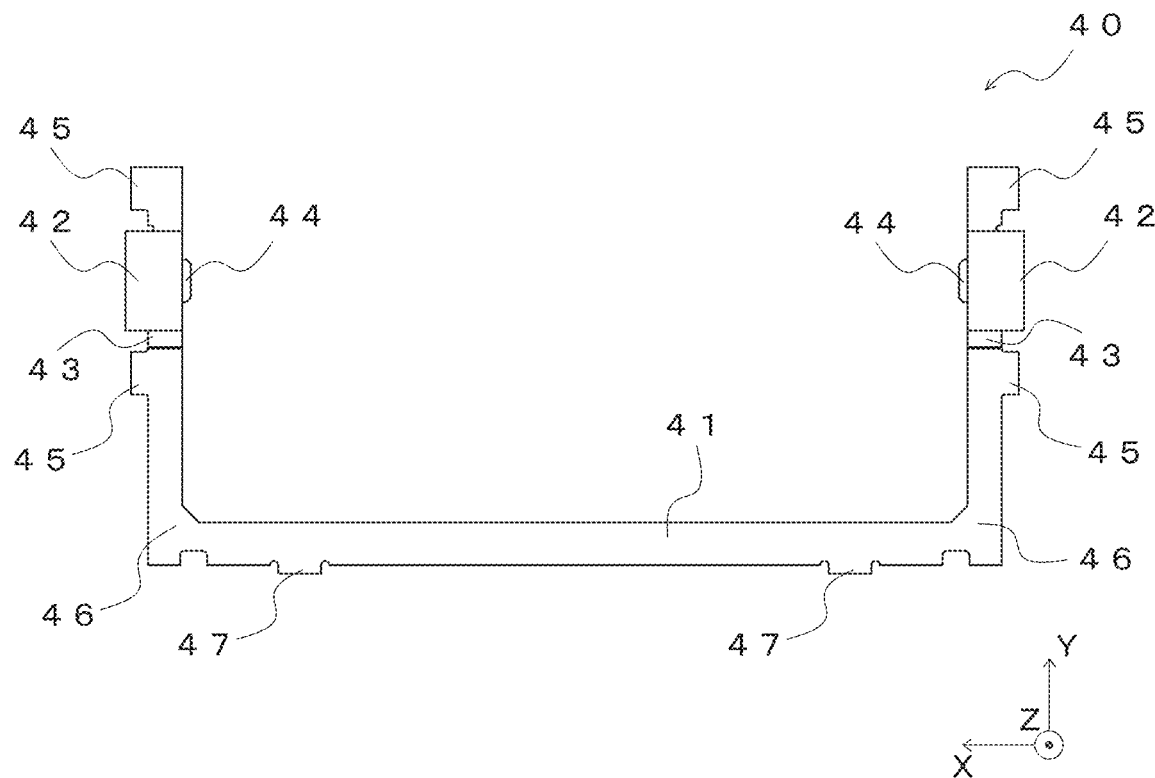
FIG. 10A is a plan view of an abutting member according to Embodiment 1 of the present disclosure.
Figure 10B:
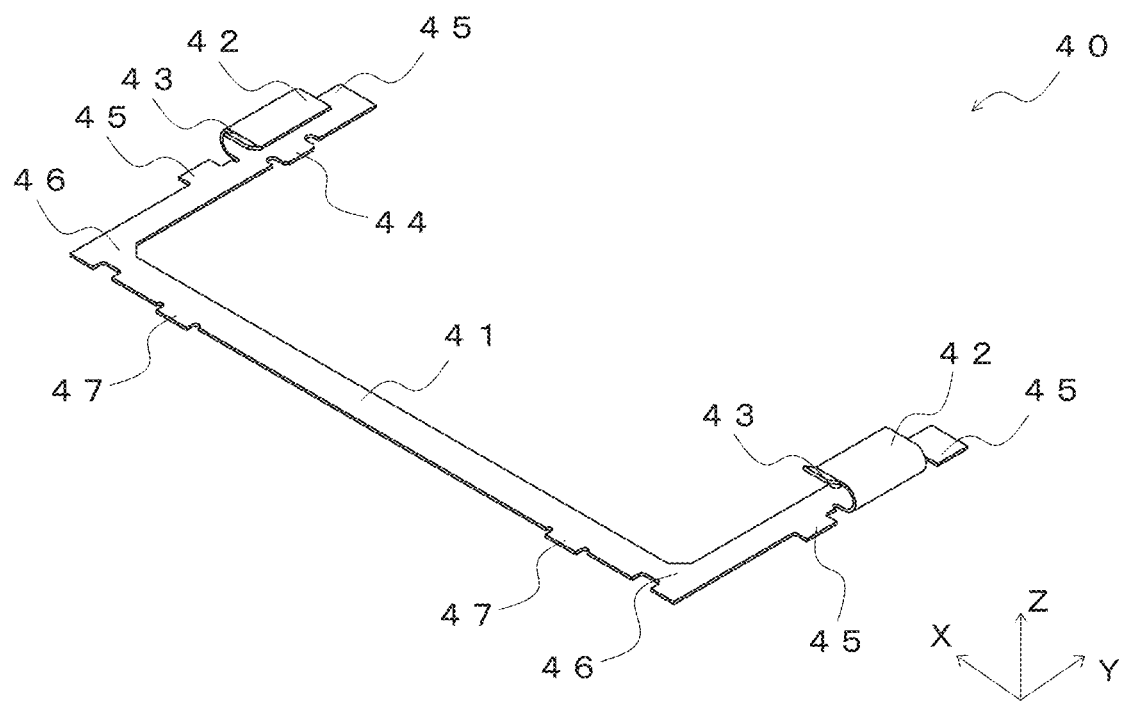
FIG. 10B is a perspective view of the abutting member according to Embodiment 1 of the present disclosure.
Figure 11B:
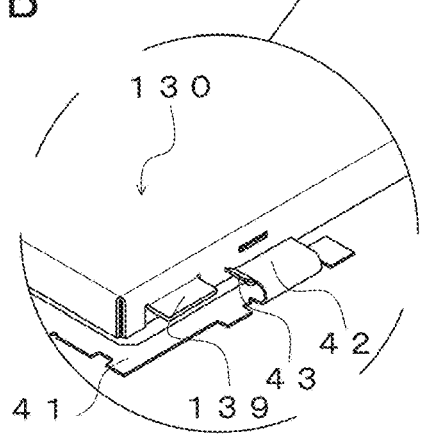
FIG. 11B is an enlarged perspective view of section B of FIG. 11A.

As illustrated in FIGS. 10A and 10B, the abutting member 40 disposed on the external circuit board 30 is a metal member that, when viewed planarly, has a substantially C-shape. The abutting member 40 includes a base 41 disposed on the external circuit board 30 and, near both ends of the base 41, a presser 42 that engages with the upper shell 130 and presses the connector 10 toward the main surface 31 of the external circuit board 30. The presser 42 has a U-shape when viewed from the front. Additionally, the abutting member 40 includes a guide 43 extending, in a shape tapered in the +Z direction, from the −Y direction end of the presser 42. As illustrated in FIG. 7A, when the connector 10 and the abutting member 40 are disposed on the main surface 31 of the external circuit board 30, the distance h2 of a lower surface of the presser 42 (distance from the main surface 31 of the external circuit board 30) is set to be less than the distance h1 of the upper surface of the engager 139 (distance from the main surface 31 of the external circuit board 30). Meanwhile, the distance h3 where the distance, from the main surface 31, of the lower surface of the guide 43 is greatest is set greater than the distance h1. Due to this, when the connector 10 illustrated in FIGS. 11A and 11B is moved in the D1 direction, the engager 139 is guided by the guide 43 so as to move a little at a time in the −Z direction. Then, when, as illustrated in FIGS. 1A and 1B, the engager 139 engages with the presser 42, as described above, distance h1>distance h2 and, as such, the engager 139 is pressed by the presser 42 toward the main surface 31 of the external circuit board 30. Additionally, as illustrated in FIG. 7B, since the presser 42 is formed in a substantially C-shape, the engager 139 that engages with the presser 42 is also pressed toward the main surface 31 of the external circuit board 30 by the urging force of the presser 42. Accordingly, when the engager 139 is positioned below the presser 42, the upper shell 130 is pressed toward the main surface 31 of the external circuit board 30.

The abutting member 40 is disposed on the external circuit board 30 and fixed, and a fixer 44 is provided at a position directly below the presser 42 (see FIGS. 10A and 10B) and/or a fixer 45 is provided on a peripheral position of the presser 42, and fixed by solder or an adhesive to the external circuit board 30. As a result, unexpected situations such as the abutting member 40 separating can be prevented by the reaction force, applied to the presser 42, generated when pressing the connector 10 toward the external circuit board 30. Additionally, a corner portion of the base 41 may also be fixed to the external circuit board 30 as a fixer 46. Alternatively, a fixer 47 may be provided between the fixers

46, 46. The numbers and positions of the fixers may be determined in accordance with the required fixing strength.

Assembly Method of Connector System

Next, an assembly method of the connector system 1 having the configuration described above is described.

Firstly, a worker inserts the terminal portion 201 of the circuit board 200 illustrated in FIGS. 8A and 8B through the insertion section 111a of the front shell 110 with the one main surface 205 facing the +Z direction (the up direction). The terminal portion 201 of the circuit board 200 protrudes from the front end 117. At this time, after the circuit board 200 passes over the engaging claws 113 (after pressing the engaging claws 113 in the −Z direction or, rather, the down direction) while bending the press-stopper 114 illustrated in FIG. 3F in the +Z direction (the up direction), the protrusions 202 of the circuit board 200 engage with the engaging claws 113 of the front shell 110. Additionally, the circuit board 200 is press-stopped in the −Z direction by the press-stopper 114. When the circuit board 200 is not correctly inserted up to the predetermined position of the insertion section 111a, the protrusions 202 interfere with the +Z direction rising portions of the engaging claws 113, and push the engaging claws 113 out in the −Z direction. Accordingly, whether the circuit board 200 is inserted up to the predetermined position can be confirmed on the basis of whether the engaging claws 113 are protruding in the −Z direction. After the circuit board 200 is inserted, the circuit board 200 and the soldering portion 116a illustrated in FIGS. 3B and 3D are soldered.

The worker applies the fixing material 400 to the other main surface 204 of the circuit board 200. The worker slides the lower shell 120 in the D1 direction along the other main surface 204 of the circuit board 200, thereby engaging the engagers 123 of the lower shell 120 with the engaged portions 112 provided on the rear end 118 of the front shell 110. At this time, the other main surface 204 of the circuit board 200 is fixed to the main surface 121a of the lower shell 120 via the fixing material 400, and the circuit board 200 is connected in a thermally conductive manner to the lower shell 120.

The worker applies the heat transferring material 410 to the regions, of a main surface 211 of the semiconductor device 210 illustrated in FIG. 8, other than the portion where the connection member 302 is connected.

The worker slides the upper shell 130 in the D1 direction along the one main surface 205 of the circuit board 200. The abutter 137 of the upper shell 130 abuts against the rear end 118 of the main body 111 of the front shell 110. Additionally, the worker engages the engagers 136 with the engaging holes 124 of the lower shell 120. Moreover, the worker mates the riser 132 of the upper shell 130 with the riser 122 of the lower shell 120, solders between the mated portion and the main body 111, and the abutter 137 of the upper shell 130, thereby achieving the state illustrated in FIGS. 9A and 9B and completing the connector 10.

As illustrated in FIG. 11A, the worker slides the connector 10 in the D1 direction on the main surface 31 of the external circuit board 30 while facing the terminal portion 201 of the completed connector 10 toward the mating connector 20 mounted on the main surface 31 of the external circuit board 30. The distance from the lower surface of the guide 43 to the main surface 31 of the external circuit board 30 gradually decreases with progression in the D1 direction and, as such, as the upper shell 130 is slid in the D1 direction, the engager 139 is pressed toward the main surface 31 of the external circuit board 30 by the guide 43. When the engager 139 is positioned below the presser 42, the upper shell 130 is further pressed toward the main surface 31 of the external circuit board 30 by the urging force of the presser 42. Additionally, the terminal portion 201 of the connector 10 mates with the mating connector 20 of the external circuit board 30, and a state such as illustrated in FIGS. 1A and 1B is achieved. As a result, the upper shell 130 is pressed against the main surface 31 of the external circuit board 30, and the heat of the connector 10 can be released via the external circuit board 30.

Figure 11C:
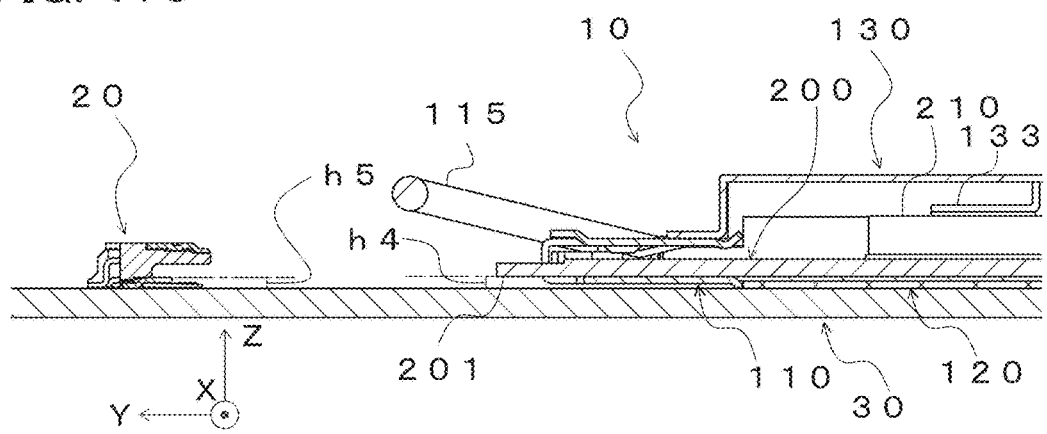
FIG. 11C is a cross-sectional view of the connector, taken along line XIC-XIC of FIG. 11A.

Note that, as illustrated in FIG. 11C, a distance h4 from the lower surface of the terminal portion 201 of the connector 10 to the main surface 31 of the external circuit board 30 and a distance h5 from the lower surface of the portion of the mating connector 20 that mates with the terminal portion 201 to the main surface 31 of the external circuit board 30 are substantially equal. As a result, a constant range of the main surface 121b of the lower shell 120 can be abutted against the main surface 31 of the external circuit board 30 due to the engager 139 being pressed by the presser 42.

According to the connector system 1 of the present embodiment, the abutting member 40 presses the Engager 139 of the upper shell 130 toward the main surface 31 of the external circuit board 30, and abuts the connector 10 against the main surface 31 of the external circuit board 30. As a result, lifting, from the external circuit board 30, of the end of the connector 10 near the signal line 300 can be suppressed. Accordingly, the lower shell 120 of the connector 10 abuts against the main surface 31 of the external circuit board 30 and, as such, can carry out heat dissipation of the connector 10 via the external circuit board 30, and a detachable connector and connector system having high heat dissipation effects can be provided. Additionally, the lower shell 120 is thermally conductive and, as such, can effectively transfer the heat generated by the connector 10 to the external circuit board 30.

According to the connector 10 of the present embodiment, the semiconductor device 210 is connected to the tongue 133 of the upper shell 130 in a thermally conductive manner via the heat transfer material 410. Due to this, the heat generated by the semiconductor device 210 spreads to the entire upper shell 130 via the tongue 133, thereby facilitating heat dissipation. Accordingly, the need for the upper shell 130 to be provided with a heat sink is reduced. Furthermore, when a heat sink is unnecessary, the size of the connector 10 can be reduced.

According to the connector 10 of the present embodiment, the semiconductor device 210 is connected to the circuit board 200 in a thermally conductive manner via the heat transfer material 420. Due to this, the heat generated by the semiconductor device 210 diffuses to the lower shell 120 via the circuit board 200, thereby facilitating heat dissipation. Accordingly, the need for the housing 100 to be provided with a heat sink is reduced. Furthermore, when a heat sink is unnecessary, the size of the connector 10 can be reduced.

Embodiment 2

Figure 12A:
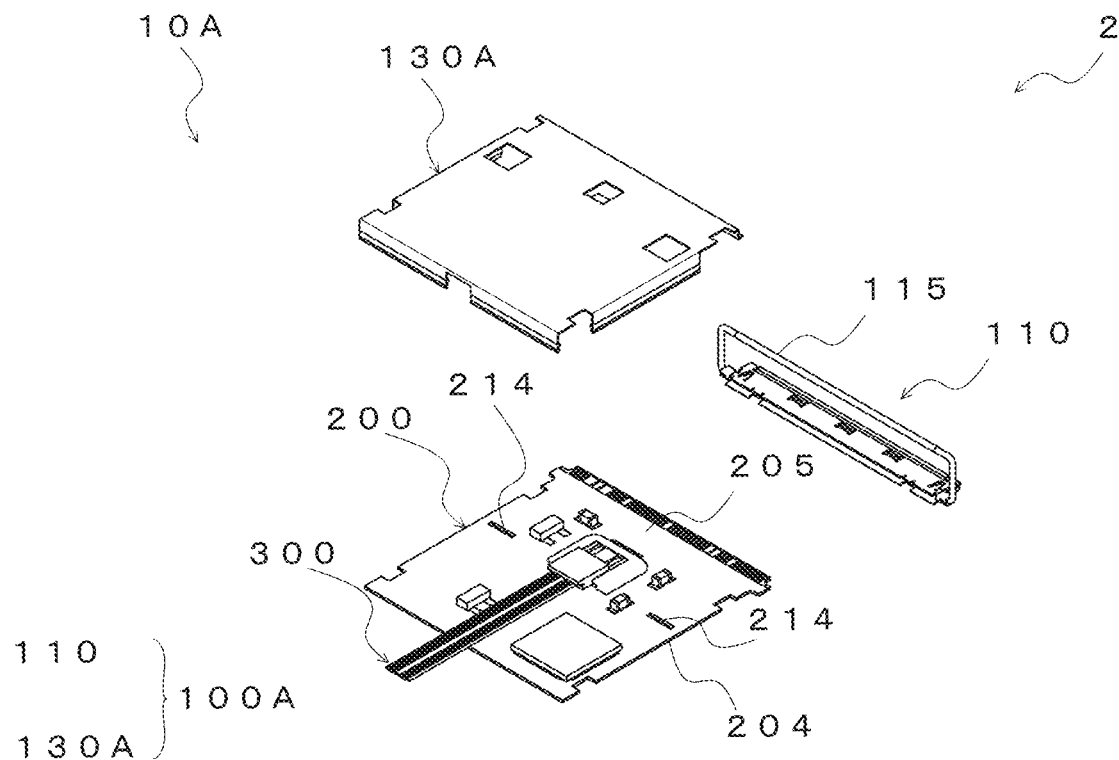
FIG. 12 is an exploded perspective view of a connector system according to Embodiment 2 of the present disclosure.
Figure 12B:
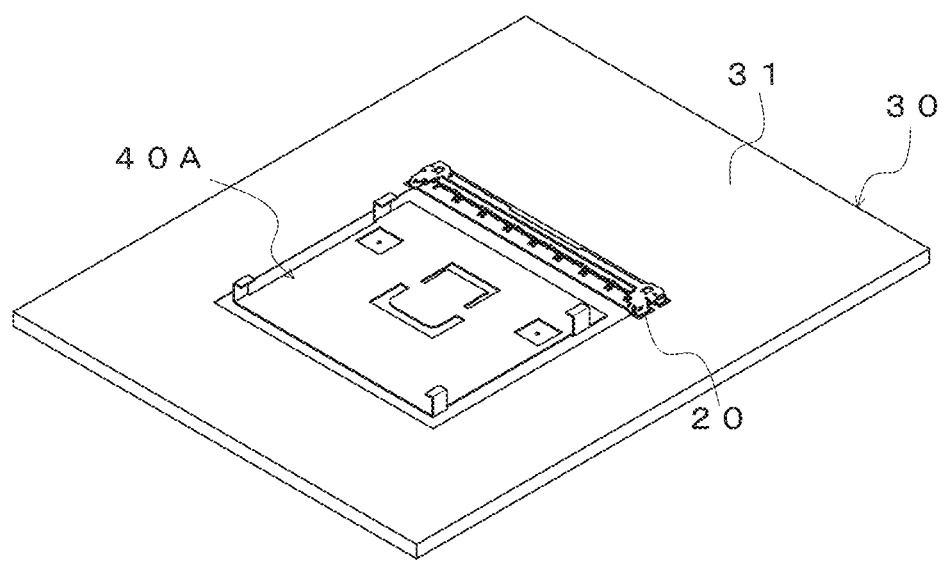
Figure 12B:
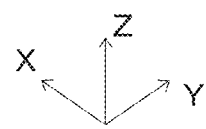
Figure 13A:
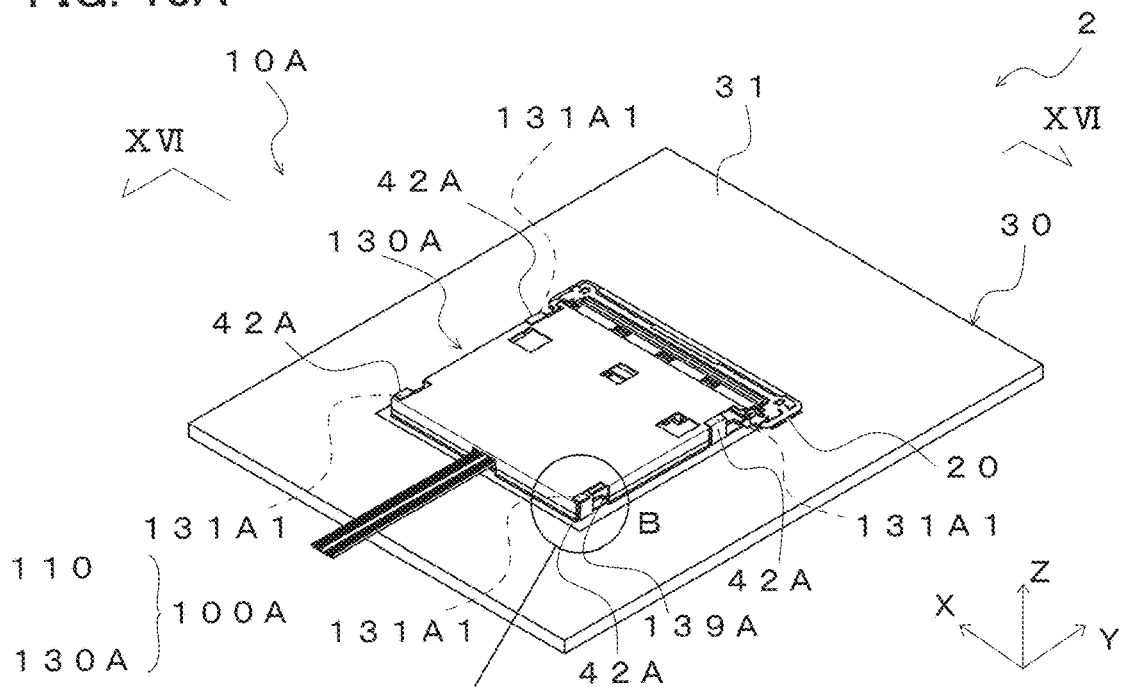
FIG. 13A is a perspective view of the connector system according to Embodiment 2 of the present disclosure.
Figure 13B:
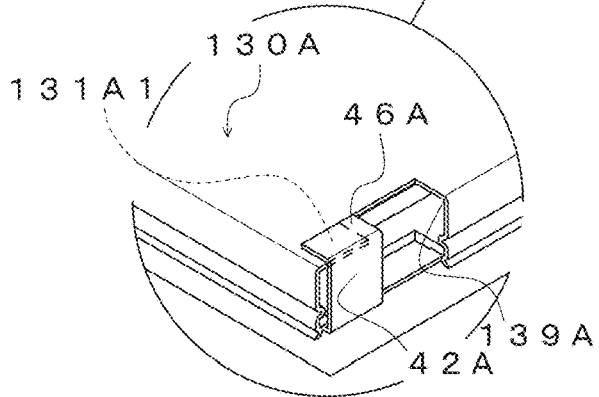
FIG. 13B is an enlarged perspective view of section B of the connector system of FIG. 13A.

With the connector system 1 of Embodiment 1, the housing 100 of the connector 10 includes the front shell 110, the lower shell 120, and the upper shell 130. However, with a connector system 2 of the present embodiment, illustrated in the exploded perspective view of FIG. 12 and in the perspective views of FIGS. 13A and 13B, a housing 100A of a connector 10A includes the front shell 110 and an upper shell 130A.

The configurations of the front shell 110 and the circuit board 200 of the connector 10A are the same as those in Embodiment 1. The configuration of the mating connector 20 is the same as that in Embodiment 1. The configuration of the upper shell 130A of the connector 10A is different from that in Embodiment 1 and, furthermore, the connector 10A does not include a lower shell. Additionally, an abutting member 40A that also performs the functions of the lower shell 120 of Embodiment 1 is disposed on the external circuit board 30.

Figure 14A:
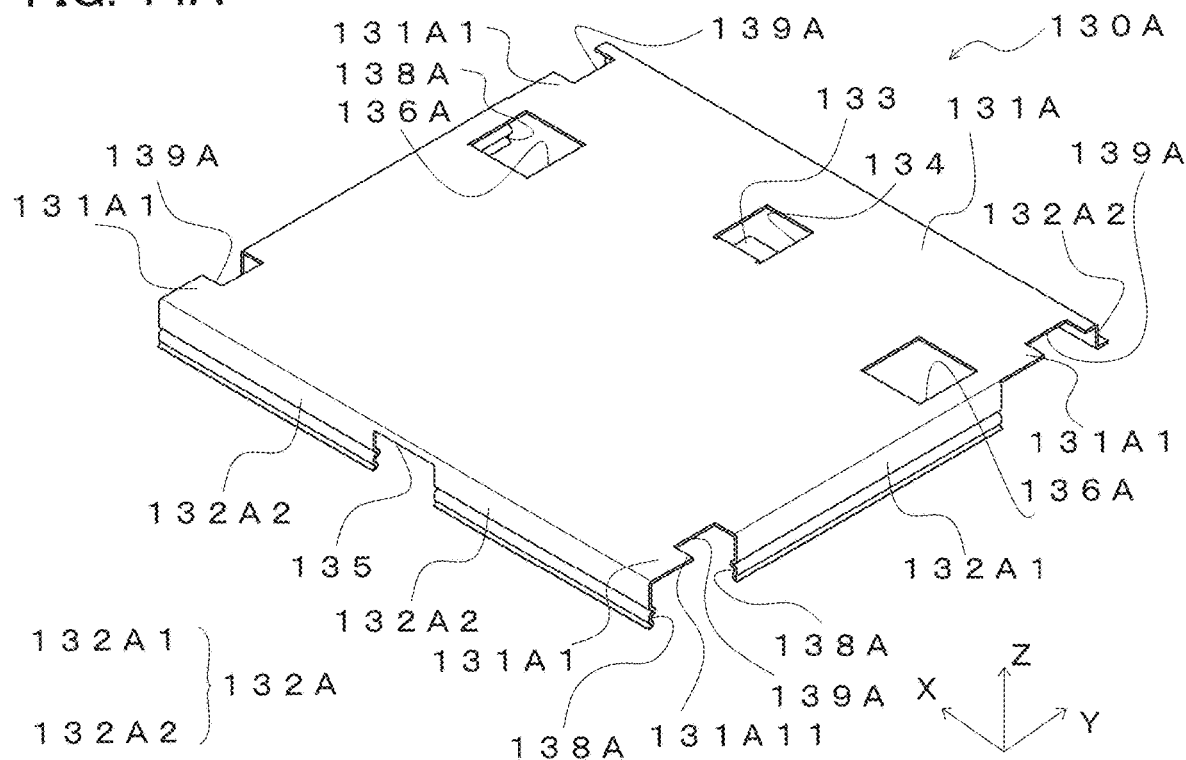
FIG. 14A is a perspective view of an upper shell according to Embodiment 2 of the present disclosure.
Figure 14B:
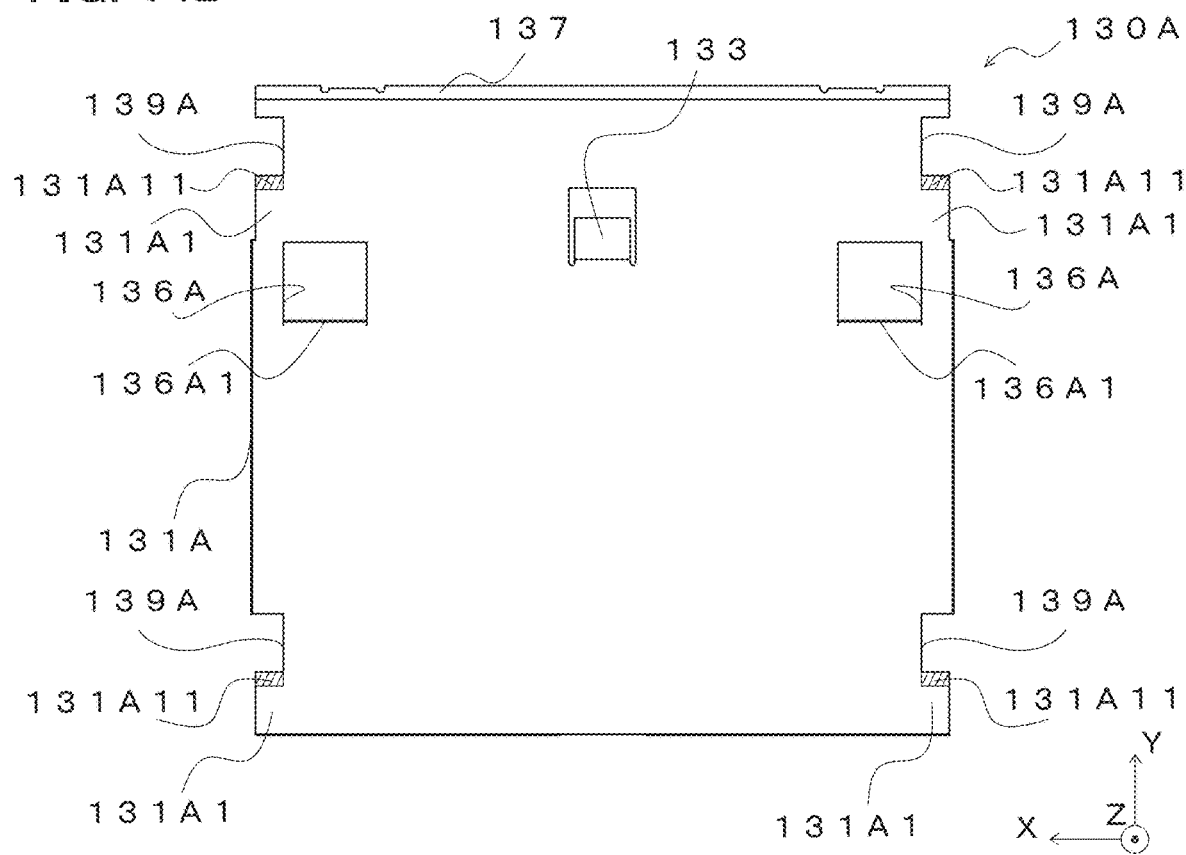
FIG. 14B is a plan view of the upper shell according to Embodiment 2 of the present disclosure.

The housing 100A is an electrically conductive member formed from a metal, for example. As illustrated in FIGS. 14A and 14B, the upper shell 130A of the housing 100A includes a flat plate-like base 131A, risers 132A (walls 132A1 and 132A2) that rise from ends of the base 131A, the tongue 133, and the abutter 137. The upper shell 130A covers at least a portion of the target region that is a region of the circuit board 200 other than the terminal portion 201. The tongue 133, the abutter 137, and the gap 134 formed around the tongue 133 are the same as in Embodiment 1.

Figure 13C:
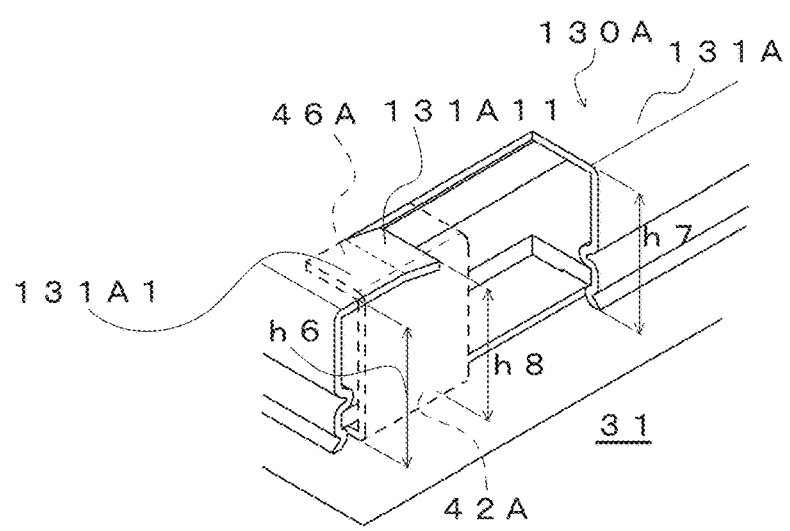
FIG. 13C is an enlarged perspective view of the connector system, in which the presser of FIG. 13B is omitted.

The base 131A is a flat plate-like member that has a substantially rectangular shape in which a slit is inserted near the center to form the tongue 133. An insertion section 139A is formed near the four corners of the base 131. The insertion section 139A is a rectangular opening and, when viewed planarly, has larger vertical and horizontal dimensions than the vertical and horizontal dimensions of a hereinafter described tip 46A. When engaging the upper shell 130A with the abutting member 40A, the hereinafter described tip 46A is inserted in the insertion section 139A. An engager 131A1 is formed adjacent to the insertion section 139A in the −Y direction. A slope 131A11 of the engager 131A1 illustrated by the diagonal lines in FIG. 14B is formed so as to incline in a tapered shape in the −Z direction, as illustrated in FIG. 13C.

The risers 132A are members that include a wall 132A1 on both X direction ends of the base 131A, and a wall 132A2 rising from the four edges of both Y direction ends of the base 131A. The risers 132A differ from the riser 132 of Embodiment 1. The adjacent wall 132A1 and the wall 132A2 are independent and do not contact each other.

As illustrated in FIG. 14A, near the tips of the walls 132A1, 132A1 and the −Y direction wall 132A2, a grove 138A that is capable of pinching the circuit board 200 is formed in a direction horizontal to the base 131A. When the circuit board 200 is pinched in the groove 138A and the connector 10A is pressed against the abutting member 40A, the other main surface 204 of the circuit board 200 contacts a hereinafter described contactor 43 A. Additionally, a hole 136A is a hole produced when forming an erect piece 136A1 in the −Z direction from the base 131A. The erect piece 136A1 is inserted into a locking hole 214 formed in the circuit board 200 illustrated in FIG. 12 to position the upper shell 130A and the circuit board 200 in the Y direction.

Figure 15A:
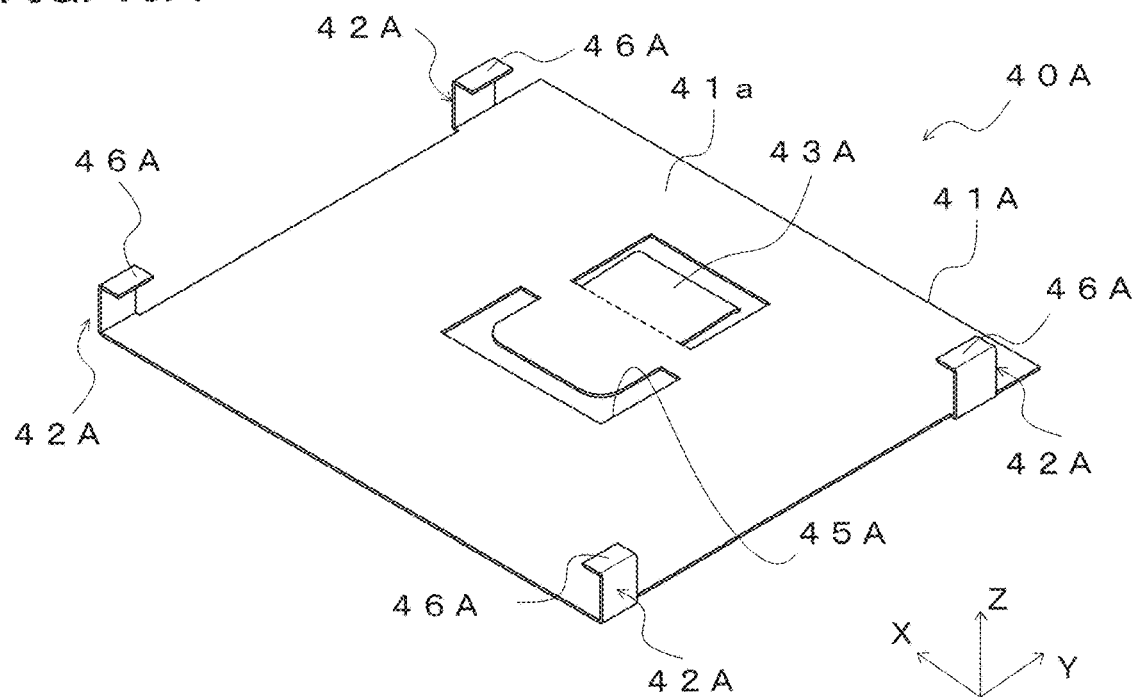
FIG. 15A is a perspective view of an abutting member according to Embodiment 2 of the present disclosure.
Figure 15B:
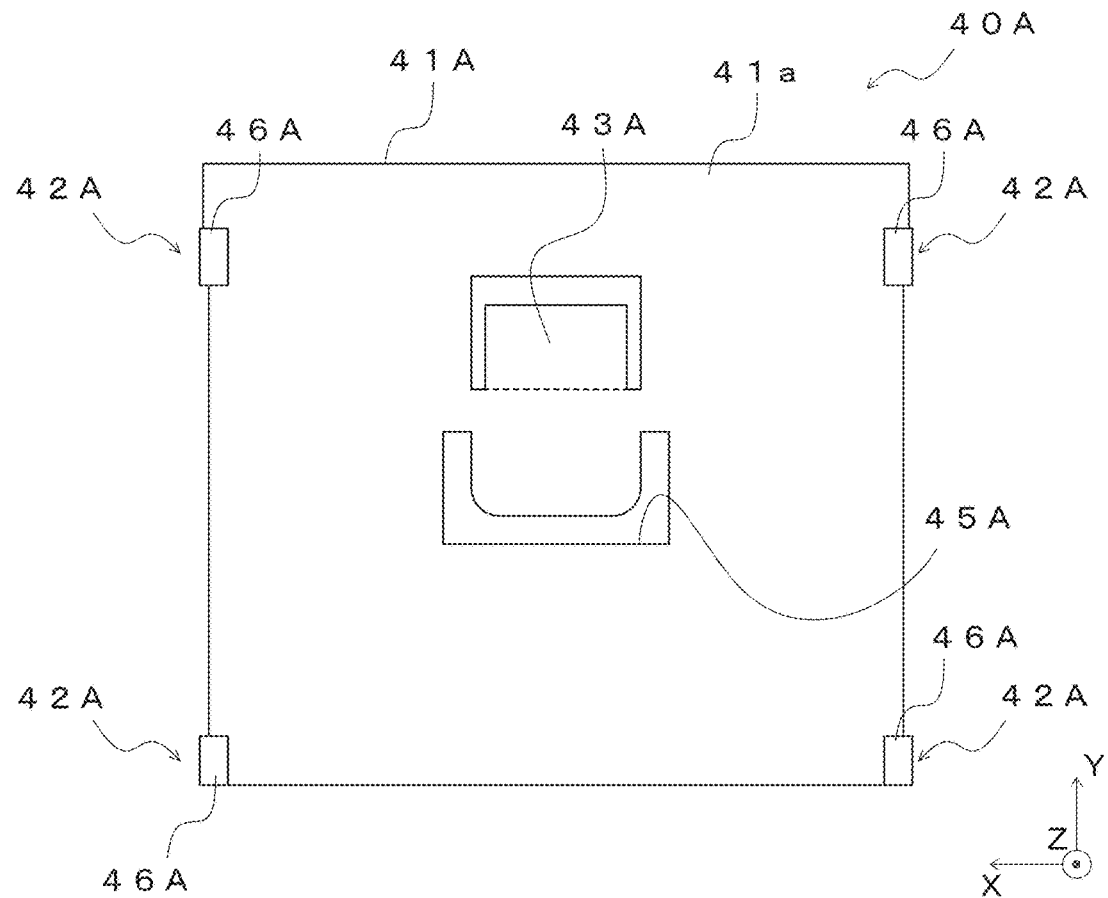
FIG. 15B is a plan view of the abutting member according to Embodiment 2 of the present disclosure.

Next, the abutting member 40A illustrated in FIGS. 15A and 15B fulfills a role of pressing the upper shell 130A toward the external circuit board 30 in the same manner as the abutting member 40 of Embodiment 1 and, also, covers at least a portion of the target region that is a region of the circuit board 200 other than the terminal portion 201. The abutting member 40A is an electrically conductive member formed from a metal, for example. The abutting member 40A includes a substantially rectangular base 41A, and a presser 42A erected at the four corners of the base 41A. As illustrated in the enlarged cross-sectional view of FIG. 16, the abutting member 40A is fixed by an electrically conductive fixing material (not illustrated in the drawings) at a predetermined position on the external circuit board 30.

As illustrated in FIGS. 15A and 15B, the base 41A is a flat plate-like member that has a substantially rectangular shape. The circuit board 200 is disposed on a main surface 41a of the base 41A. A contactor 43A that contacts the circuit board 200 is formed somewhat in the +Y direction from the center of the base 41A. Additionally, a substantially U-shaped soldering hole 45A when viewed planarly is formed very near the contactor 43A on the base 41A.

Figure 16:
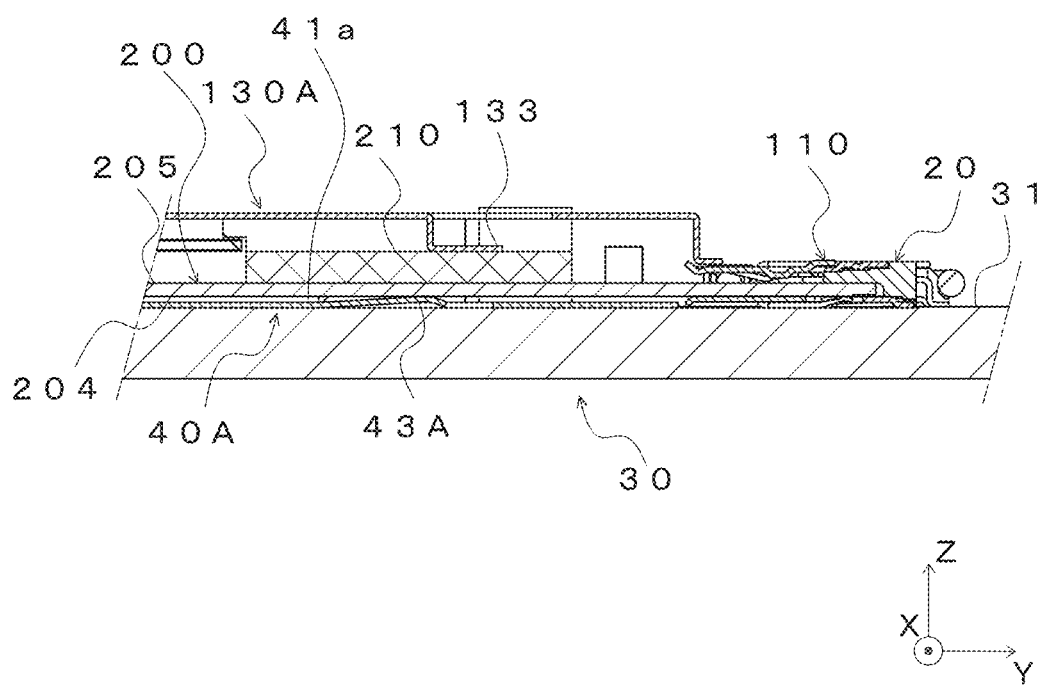
FIG. 16 is a cross-sectional view of a connector system, taken along line XVI-XVI of FIG. 13A.

The contactor 43A is formed such that a tongue piece portion is slightly bent in the +Z direction (direction in which the circuit board 200 is disposed) from the base 41A (see FIG. 16). The contactor 43A abuts opposite the position where the semiconductor device 210, which is a heat generating member of the circuit board 200, is disposed and, as a result, facilitates heat dissipation of the semiconductor device 210.

The soldering hole 45A is a hole for soldering the abutting member 40A to the external circuit board 30, and is provided near the contactor 43A in order to facilitate heat dissipation from the semiconductor device 210 to the external circuit board 30.

The presser 42A is erected near the four corners of the base 41A, and includes, at a tip thereof, a tip 46A that is bent so as to oppose the base 41A. As illustrated in FIG. 13C, a distance h6, from the external circuit board 30, of a lower surface of the tip 46A is somewhat less than a distance h7, from the external circuit board 30, of the base 131A of the upper shell 130, and somewhat greater than a distance h8 of the slope 131A11 from the external circuit board 30. After the tip 46A is inserted through the insertion section 139A of the upper shell 130, the upper shell 130A is slid in the +Y direction (the front shell 110 direction) and the tip 46A engages with a hereinafter described engager 131A1 of the base 131A of the upper shell 130A (see FIG. 13B). As the upper shell 130A is slid further in the +Y direction, the (tip 46A of the) presser 42A presses and abuts the upper shell 130A against the (contactor 43A of the) main surface 41a of the abutting member 40A.

According to the connector system 2 of Embodiment 2, the upper shell 130A that is pinching the circuit board 200 is moved downward from above the abutting member 40 and, then, is slid in the +Y direction. As a result, the presser 42A of the abutting member 40A presses the engager 131A1 of the upper shell 130A toward the main surface 31 of the external circuit board 30. The other main surface 204 of the circuit board 200, which is pinched by the groove 138A of the upper shell 130A of the connector 10A, is abutted against the (contactor 43A of the) main surface 41a of the abutting member 40. As a result, lifting, from the external circuit board 30, of the end of the connector 10A near the signal line 300 can be suppressed. Accordingly, the circuit board 200 of the connector 10A abuts against the main surface 31 of the external circuit board 30 and, as such, can efficiently carry out heat dissipation of the connector 10A via the external circuit board 30, and a small, detachable connector 10A and connector system 2 having high heat dissipation effects can be provided. Additionally, the abutting member 40A is thermally conductive and, as such, can effectively transfer the heat generated by the connector 10A to the external circuit board 30. Furthermore, with the connector system 2, the abutting member 40A also serves as the lower shell 120 of Embodiment 1 and, as such, the need to separately prepare a lower shell is eliminated, and the number of components and work processes can be reduced compared to Embodiment 1.

Various embodiments of the present disclosure are described above, but the present disclosure is not limited by the embodiments described above.

Modified Examples

In the various embodiments described above, examples are described in which the connector 10, 10A is an AOC connector, but the connector 10, 10A may be an electrical connector. Additionally, the semiconductor device 210 may be a general circuit that does not include a silicon photonics circuit. Moreover, the signal line need not include an optical fiber.

In Embodiment 1, the housing 100 includes, as three individual members, the front shell 110, the lower shell 120, and the upper shell 130. However, the front shell 110 and the lower shell 120, or the front shell 110 and the upper shell 130 may be integrally formed. As a result, the need to provide a connection portion between the integrally formed shells is eliminated, thereby making it possible to reduce the size of the connector. Moreover, the manufacturing processes and number of components of the connector can be reduced, the manufacturing process can be shortened, and costs can be reduced.

In Embodiment 1, when viewed planarly, the abutting member 40 has a substantially C-shape, but a configuration is possible in which the abutting member has, for example, a substantially upside-down U shape when viewed from the front and holds down the base of the upper shell from above, or the abutting member is a stretchable rubber component and holds down the base 131 of the upper shell 130 from above. Additionally, the base of the abutting member 40 has a C-shape when viewed planarly, but the abutting member may have other shapes, may be divided into two, or the like. Moreover, the number and positions of the presser 42 are not limited to those described in Embodiment 1. The engager 139 is formed at two locations, but the number of the engager 139 may be increased/decreased as needed, and the position of the engager 139 may be changed.

In Embodiment 1 described above, when viewed from the side, the abutting member 40 includes the presser 42 that is horizontal to the external circuit board 30 and the inclined guide 43. However, a configuration is possible in which a presser is not provided. Additionally, a configuration is possible in which the abutting member does not include a guide, the upper shell 130 is slid toward the mating connector 20 while pressing the upper shell 130 toward the external circuit board 30, and engages/presses the engager 139 with/against the presser. Alternatively, a configuration is possible in which the abutting member does not include a guide, and the upper shell is pressed toward the external circuit board 30 as a result of the connector being slid in the +Y direction due to the upper surface of the upper shell 130 being configured to progress in the +Z direction in accordance with progression in the +Y direction when viewed from the side.

In Embodiment 1, the abutting member 40 includes the presser 42, and the upper shell 130 includes the engager 139. However, the abutting member may include a presser that is the same as the presser 42A of Embodiment 2, and the upper shell may include an engager and a slope that are the same as the engager 131A1 and the slope 131A11 of Embodiment 2. In such a case, a contactor that is the same as the contactor 43A of Embodiment 2 may be provided on the base of the lower shell, or a configuration is possible in which the components other than the lower shell have the configurations of Embodiment 1, and a contactor is provided on the base of the lower shell.

In Embodiment 2, a configuration is described in which the connector 10A is pressed against the abutting member 40A by the presser 42A, the insertion section 139A, the engager 131A1, and the like. However, a configuration is possible in which an engager the same as in Embodiment 1 is provided on the upper shell, and a presser the same as in Embodiment 1 is provided on the abutting member.

In Embodiment 2, the abutting member 40A includes the slope 131A11, but a configuration is possible in which a slope is not provided, and the upper shell is slid while being pressed by, for example, a substantially C-shaped vertical groove of the groove 138A expanding and contracting in the ±Z direction to engage/press the engager with/against the presser.

In Embodiment 2, the presser 42A, the insertion section 139A, the engager 131A1, and the like are provided at two locations in the +Y direction and two locations in the −Y direction. However, configurations are possible in which, for example, these components are not provided in the +Y direction, are not provided in the −Y direction, or are provided at other positions, or the numbers of components provided on the +X end side and the −X end side are different.

In Embodiment 2, when the circuit board 200 is pinched in the groove 138A and the connector 10A is pressed against the abutting member 40A, the other main surface 204 of the circuit board 200 contacts the connector 43A, but a configuration is possible in which the main surface 204 of the circuit board 200 abuts against the base 41A other than the contactor 43A.

In Embodiment 2, the contactor 43A is provided on the base 41A at one location, but the contactor may be provided at a position other than on the base and one or a plurality of the contactor may be provided. Alternatively, a configuration is possible in which the contactor is not provided on the base and, for example, unevennesses are formed on an entirety of the base of the abutting member, and the circuit board 200 is brought into contact with the base of the abutting member.

In Embodiment 2, the groove 138A is formed in a substantially C-shape near the −Z direction end of the wall 132A1, 132A2. However, instead of the groove, a structure is possible in which, for example, a lower end of the wall bends toward the base 131A, a lower end of the wall 132A2 is abutted against the one main surface 205 of the circuit board 200, and an upper end of the wall 132A1 is abutted against the other main surface 204 of the circuit board 200 to pinch the circuit board 200.

In the various embodiments, an example is described in which the insertion port 135 is provided on the upper shell 130, 130A. However, a configuration is possible in which the insertion section is provided on the lower shell or the abutting member, and the circuit board is fixed to the upper shell via a fixing material.

In Embodiment 1, the lower shell 120 and the upper shell 130 are mated with each other, but a configuration is possible in which the lower shell and the upper shell are fixed by being placed end-to-end against each other and being soldered.

In Embodiment 1 and Embodiment 2, the tongue 133 is formed on the upper shell 130, 130A, but configuration is possible in which a heat dissipation plate (heat transfer plate) is disposed between the upper shell 130, 130A and the semiconductor device 210 of the circuit board 200, and the tongue is not provided. In such a case, the heat dissipation plate (heat transfer plate) transfers the heat generated from the semiconductor device 210 to the upper shell 130, and the heat dissipation effects can be enhanced in a similar manner. Alternatively, a configuration is possible in which both the tongue and the heat dissipation plate are provided.

The foregoing describes some example embodiments for explanatory purposes. Although the foregoing discussion has presented specific embodiments, persons skilled in the art will recognize that changes may be made in form and detail without departing from the broader spirit and scope of the invention. Accordingly, the specification and drawings are to be regarded in an illustrative rather than a restrictive sense. This detailed description, therefore, is not to be taken in a limiting sense, and the scope of the invention is defined only by the included claims, along with the full range of equivalents to which such claims are entitled.

This application claims the benefit of Japanese Patent Application No. 2020-081320, filed on May 1, 2020, the entire disclosure of which is incorporated by reference herein.

REFERENCE SIGNS LIST 1, 2 Connector system
10, 10A Connector
20 Mating connector
21 Wall surface
30 External circuit board
31 Main surface
32 Copper foil
40, 40A Abutting member
41, 41A Base
41a Main surface
42, 42A Presser
43 Guide
43A Contactor
44, 45, 46, 47 Fixer
45A Soldering hole
46A Tip
100, 100A Housing
110 First shell (front shell)
120 Third shell (lower shell)
130, 130A Second shell (upper shell)
111 Main body
111a Insertion section
111b Opposing section
111c Cover section
111d Connection section
112 Engaged portion
113 Engaging claw
114 Press-stopper
115 Lock bar
116a Soldering portion
116b Abutter
117 One end (front end)
118 Other end (rear end)
119 Recess
121 Base
121a, 121b Main surface
122 Riser
123 Engager
124 Engaging hole
125 Protrusion
126 Soldering portion
127 Restraining claw
128 Insertion claw
131, 131A Base
131A1 Engager
131A11 Slope
132, 132A Riser
132A1, 132A2 Wall
133 Tongue
134 Gap
135 Insertion port
136 Engager
136A Hole
136A1 Erect piece
137 Abutter
138 Recess
138A Groove
139 Engager
139A Insertion section
200 Circuit board
201 Terminal portion
202 Protrusion
203 Connection terminal
204 Other main surface
205 One main surface
206 Insertion hole
210 Semiconductor device
211 Main surface
212 Light emitting element
213 Light receiving element
214 Locking hole
300 Signal line
301 Optical fiber
302 Connection member
303 Reflecting mirror
400 Fixing material
410 Heat transfer material
420 Heat transfer material
D1, D2 Direction
h1 to h8 Distance

The invention claimed is:

1. A connector system, comprising:
a connector that detachably mates with a mating connector mounted on an external circuit board; and
an abutting member fixed to the external circuit board, wherein
the connector includes a circuit board that connects to an external device via a signal line, an electrically conductive first shell through which a terminal portion of the circuit board is inserted and that is electrically connected to the external circuit board via the mating connector, and an electrically conductive second shell that covers at least a portion of a target region that is a region, of one main surface of the circuit board, other than the terminal portion, and
the abutting member presses at least a portion of the connector toward the external circuit board and a main surface of the connector connected to the circuit board in a thermally conductive manner is thereby abutted against a main surface of the external circuit board.

2. The connector system according to claim 1, wherein the abutting member detachably fixes a position of the connector to the external circuit board, the position being closer to an end opposite the terminal portion than to the terminal portion.

3. The connector system according to claim 2, wherein the abutting member covers at least a portion of a target region that is a region, of another main surface of the circuit board, other than the terminal portion.

4. The connector system according to claim 2, wherein the circuit board is fixed to the second shell.

5. The connector system according to claim 1, wherein the abutting member covers at least a portion of a target region that is a region, of another main surface of the circuit board, other than the terminal portion.

6. The connector system according to claim 5, wherein the abutting member includes a contactor that contacts the other main surface of the circuit board.

7. The connector system according to claim 5, wherein the circuit board is fixed to the second shell.

8. The connector system according to claim 6, wherein the circuit board is fixed to the second shell.

9. The connector system according to claim 6, wherein the contactor contacts the circuit board at a position opposing, across the circuit board, a heat generating member disposed on the circuit board.

10. The connector system according to claim 9, wherein the circuit board is fixed to the second shell.

11. The connector system according to claim 1, wherein the circuit board is fixed to the second shell.

12. A connector system comprising:
a connector that detachably mates with a mating connector mounted on an external circuit board; and
an abutting member fixed to the external circuit board, wherein
the connector includes a circuit board that connects to an external device via a signal line, an electrically conductive first shell through which a terminal portion of the circuit board is inserted and that is electrically connected to the external circuit board via the mating connector, and an electrically conductive second shell that covers at least a portion of a target region that is a region, of one main surface of the circuit board, other than the terminal portion,
the abutting member presses at least a portion of the connector toward the external circuit board,
the abutting member includes a presser that presses the second shell toward the external circuit board and fixes the second shell,
the second shell includes an engager with which the presser engages, and
a plurality of each of the presser and the engager is formed aligned in a direction crossing a direction in which the signal line extends.

13. The connector system according to claim 12, wherein a plurality of each of the presser and the engager is formed aligned in the direction in which the signal line extends.

14. The connector system according to claim 12, wherein
the abutting member covers at least a portion of a target region that is a region, of another main surface of the circuit board, other than the terminal portion,
the abutting member includes a contactor that contacts the other main surface of the circuit board, and
the contactor contacts the circuit board at a position opposing, across the circuit board, a heat generating member disposed on the circuit board.

15. A connector system comprising:
a connector that detachably mates with a mating connector mounted on an external circuit board; and
an abutting member fixed to the external circuit board, wherein
the connector includes a circuit board that connects to an external device via a signal line, an electrically conductive first shell through which a terminal portion of the circuit board is inserted and that is electrically connected to the external circuit board via the mating connector, and an electrically conductive second shell that covers at least a portion of a target region that is a region, of one main surface of the circuit board, other than the terminal portion,
the abutting member presses at least a portion of the connector toward the external circuit board, and
the abutting member includes a presser that presses the second shell toward the external circuit board and fixes the second shell, and is fixed to the external circuit board by a fixer provided at at least a position directly below the presser or at a peripheral position of the position directly below.

16. A connector that detachably mates with a mating connector mounted on an external circuit board,
the connector comprising a circuit board that connects to an external device via a signal line;
an electrically conductive first shell through which a terminal portion of the circuit board is inserted and that is electrically connected to the external circuit board via the mating connector; and
an electrically conductive second shell that covers at least a portion of a target region that is a region, of one main surface of the circuit board, other than the terminal portion, wherein
the connector is detachably installed on the external circuit board by an abutting member fixed to the external circuit board, and
the connector further includes a thermally conductive third shell that, in a state in which the connector is fixed to a main surface of the external circuit board, is fixed to the main surface of the external circuit board due to a portion of the second shell being pressed by the abutting member, and covers at least a portion of a target region that is a region, of another main surface of the circuit board, other than the terminal portion.

17. A connector system comprising:
a connector that detachably mates with a mating connector mounted on an external circuit board; and
an abutting member fixed to the external circuit board, wherein
the connector includes a circuit board that connects to an external device via a signal line, an electrically conductive first shell through which a terminal portion of the circuit board is inserted and that is electrically connected to the external circuit board via the mating connector, and an electrically conductive second shell that covers at least a portion of a target region that is a region, of one main surface of the circuit board, other than the terminal portion,
the abutting member presses at least a portion of the connector toward the external circuit board, and
the connector further includes a thermally conductive third shell that, in a state in which the connector is fixed to a main surface of the external circuit board, is fixed to the main surface of the external circuit board due to a portion of the second shell being pressed by the abutting member, and covers at least a portion of a target region that is a region, of another main surface of the circuit board, other than the terminal portion.

18. The connector system according to claim 17, wherein the circuit board is fixed to the second shell.

19. The connector system according to claim 17, wherein
the abutting member includes a presser that presses the second shell toward the external circuit board and fixes the second shell,
the second shell includes an engager with which the presser engages, and a plurality of each of the presser and the engager is formed aligned in a direction crossing a direction in which the signal line extends.

20. The connector system according to claim 17, wherein the abutting member detachably fixes a position of the connector to the external circuit board, the position being closer to an end opposite the terminal portion than to the terminal portion.

\* \* \* \* \*